US010917009B2

(12) United States Patent
Adell et al.

(10) Patent No.: US 10,917,009 B2
(45) Date of Patent: Feb. 9, 2021

(54) DIGITAL MULTIPHASE HYSTERETIC POINT-OF-LOAD DC/DC CONVERTER

(71) Applicant: California Institute of Technology, Pasadena, CA (US)

(72) Inventors: Philippe C. Adell, Pasadena, CA (US); Ming Sun, Tempe, AZ (US); Bertan Bakkaloglu, Scottsdale, AZ (US)

(73) Assignees: CALIFORNIA INSTITUTE OF TECHNOLOGY, Pasadena, CA (US); ARIZONA BOARD OF REGENTS ON BEHALF OF ARIZONA STATE UNIVERSITY, Scottsdale, AZ (US)

(*) Notice: Subject to any disclaimer, the term of this patent is extended or adjusted under 35 U.S.C. 154(b) by 635 days.

(21) Appl. No.: 15/672,652

(22) Filed: Aug. 9, 2017

(65) Prior Publication Data

US 2018/0048232 A1   Feb. 15, 2018

Related U.S. Application Data

(60) Provisional application No. 62/372,458, filed on Aug. 9, 2016.

(51) Int. Cl.
*H02M 3/157* (2006.01)
*H02M 3/158* (2006.01)
(Continued)

(52) U.S. Cl.
CPC ......... *H02M 3/157* (2013.01); *H02M 3/158* (2013.01); *H02M 3/1563* (2013.01);
(Continued)

(58) Field of Classification Search
USPC .......................................... 307/9.1
See application file for complete search history.

(56) References Cited

U.S. PATENT DOCUMENTS 8,710,810 B1 * 4/2014 McJimsey ........... H02M 3/1584
                                                 323/272

OTHER PUBLICATIONS

Li, P. et al., "A Delay-Locked Loop Synchronization Scheme for High-Frequency Multiphase Hysteretic DC-DC Converters," IEEE J. Solid-State Circuits, vol. 44, No. 11, pp. 3131-3145, Nov. 2009.

(Continued)

*Primary Examiner* — Rexford N Barnie
*Assistant Examiner* — Xuan Ly
(74) *Attorney, Agent, or Firm* — Gates & Cooper LLP

(57) ABSTRACT

An autozeroed comparator controls a frequency $f_{sw}$ of the input voltage inputted to a DC/DC converter. A digital frequency synchronization circuit is connected to the autozeroed comparator so as to form a phase locked loop, wherein the DFS circuit controls the hysteretic window of the autozeroed comparator so as to lock $f_{sw}$ to a clock reference frequency. A plurality of slave phase circuits may be connected to the master phase circuit including the DFS circuit and the autozeroed comparator. Duty cycle calibration circuits adjust a duty cycle signal applied to each of the slave phase circuits, in response to average current measured in the slave phase circuits, so that each slave phase circuit is synchronized with the master phase circuit. A 6 A 90.5% peak efficiency 4-phase hysteretic quasi-current-mode buck converter is provided with constant frequency and maximum ±1.5% current mismatch between the slave phases and the master phase.

20 Claims, 33 Drawing Sheets

(51) Int. Cl.
  *H03L 7/085* (2006.01)
  *H03L 7/093* (2006.01)
  *H02M 3/156* (2006.01)
  *H04B 7/14* (2006.01)

(52) U.S. Cl.
  CPC .......... *H02M 3/1584* (2013.01); *H03L 7/085* (2013.01); *H03L 7/093* (2013.01); *H04B 7/14* (2013.01)

(56) References Cited

OTHER PUBLICATIONS

Huang, C. et al., "An 82.4% Efficiency Package-Bondwire-Based Four-Phase Fully Integrated Buck Converter with Flying Capacitor for Area Reduction," ISSCC Dig. Tech. Papers, pp. 362-364, Feb. 2013.
Song, M.K. et al., "A 6A 40MHz Four-Phase ZDS Hysteretic DC-DC Converter with 118mV Droop and 230ns Response Time for a 5A/5ns Load Transient," ISSCC Dig. Tech. Papers, pp. 80-81, Feb. 2014.
Lee, S.H. et al., "A 0.518mm2 quasi-current-mode hysteretic buck DC-DC converter with 3 μs load transient response in 0.35 μm BCDMOS", ISSCC Dig. Tech. Papers, pp. 1-3, Feb. 2015.
Li, P. et al., "A 90-240 MHz hysteretic controlled DC-DC buck converter with digital phase locked loop synchronization," IEEE J. Solid-State Circuits, vol. 46, No. 9, pp. 2108-2119, Sep. 2011.
TI marketing literature TPS50601-SP POL.pdf 2012.
Intersil ISL70001SRH SEE Test Report Feb. 2010.
Intersil JEDEC presentation, May 2010.
TI TPS50601-SP Single Event Effects Test Report slak017.pdf.

* cited by examiner

Table 5. Target Electrical Specifications: Temp = -55 to +125°C, V_IN = 4.5 - 5.5 V unless otherwise noted

| Electrical Specifications | | | | | | |
|---|---|---|---|---|---|---|
| PARAMETER | SYMBOL | TEST CONDITIONS | MIN | TYP | MAX | UNITS |
| DVDD AND PVDD | | | | | | |
| VDD Supply Current | IDDQ | EN = 0V, DVDD=PVDD=5V (common) | | 10 | | mA |
| VDD Supply Current | IDDO | EN = 0V, DVDD=PVDD=5V (common) | | 10 | | mA |
| LOGIC INPUT VOLTAGE | | | | | | |
| Input High Voltage Minimum | VIH | | | | 70 | %VDD |
| Input Low Voltage Maximum | VIL | | 30 | | | %VDD |
| LOGIC INPUT CURRENT | | | | | | |
| Input High Current | IIH | VIH=DVDD | 0 | 0.1 | | µA |
| Input Low Current | IIL | VIL=VSS | 0 | 0.1 | | µA |
| VDD UVLO THRESHOLD | | | | | | |
| VDD, PVDD Rising UVLO Threshold Voltage | VUVR | | 1.9 | 2 | 2.1 | V |
| VDD, PVDD Falling UVLO Threshold Voltage | VUVF | | | | | V |
| SOFT-START | | | | | | |
| Soft-Start Slew Rate | SSSR | | | 10 | | mV/µs |
| Soft-Start Delay from Enable High | SSD | | | 0.1 | | µs |

FIG. 23

| POWER-GOOD | | | | | | |
|---|---|---|---|---|---|---|
| PGOOD Pull-Down Impedance | RPG | | | 50 | | Ω |
| PGOOD Leakage Current | IPG | | | | 1 | µA |
| CURRENT SENSE | | | | | | |
| Average OCP Trip Level | IOCP | | | | | mA |
| Short-Circuit Protection Threshold | IOSC | | | | | mA |
| Sensed Current Tolerance | ISCT | -10 | | 10 | | % |
| HIGH AND LOW SIDE SWITCHES | | | | | | |
| HSS On Resistance | RHSS | | 80 | 100 | | mΩ |
| LSS On Resistance | RLSS | | 50 | 65 | | mΩ |
| HSS Off Leakage | IHSS | | | 10 | | µA |
| LSS Off Leakage | ILSS | | | 10 | | µA |
| ACCURACY | | | | | | |
| Internal VREF Accuracy | VREFA | Nominal 1.00V internal reference, $Z_L$>1M | -2 | 0 | 2 | % |
| Regulation Loop Accuracy | REGA | External VREF=1.000V | -1 | 0 | 1 | % |
| SWITCHING FREQUENCY | | | | | | |
| Free Running Frequency | FSWF | | 4.5 | 5 | 5.5 | MHz |
| Locked Running Frequency | FSWL | FREF=5MHz | 4.95 | 5 | 5.05 | MHz |
| Switch Cross-conduction Dead Time | TDT | | 2.8 | 5 | 8.7 | nS |

FIG. 23 CONTINUED

| DYNAMIC ACCURACY | | | | | |
|---|---|---|---|---|---|
| Load Overshoot | LOS | 8A/100nS load step | | 10 | % |
| Load Undershoot | LUS | -8A/100nS load step | -10 | | % |
| Settling Time to 1% | TSS | +/-8A/100nS load step | | 10 | µs |
| CURRENT SHARING ACCURACY | | | | | |
| Slave Ohase Current Matching To Master | ISM2,3,4 | Imaster=2A | -1 | 1 | % |
| CONVERSION EFFICIENCY | | | | | |
| EFFICIENCY | EFF1 | VIN=5.0 VOUT=1.0 ILOAD=10A | | 90 | % |

FIG. 23 CONTINUED

DIGITAL MULTIPHASE HYSTERETIC POINT-OF-LOAD DC/DC CONVERTER

CROSS REFERENCE TO RELATED APPLICATIONS

This application claims the benefit under 35 U.S.C. Section 119(e) of commonly-assigned U.S. Provisional Patent Application Ser. No. 62/372,458, filed on Aug. 9, 2016, by Philippe C. Adell and Bertan Bakkaloglu, entitled "DIGITAL MULTIPHASE HYSTERETIC POINT-OF-LOAD DC/DC CONVERTER", (CIT-7588-P); which application is incorporated by reference herein.

STATEMENT REGARDING FEDERALLY SPONSORED RESEARCH AND DEVELOPMENT

The invention described herein was made in the performance of work under a NASA contract NNN12AA01C, and is subject to the provisions of Public Law 96-517 (35 USC 202) in which the Contractor has elected to retain title.

BACKGROUND OF THE INVENTION

1. Field of the Invention

The present invention relates to DC/DC converters.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

Although a single-phase DC-DC converter works well for low current applications, power efficiency and thermal management become an issue when the peak current of the application processors (APs) reaches several amperes or more. With limited printed circuit board (PCB) area for next generation APs, a simple hysteretic control is an attractive solution compared to pulse width modulation (PWM) control because no bulky compensation components are needed off-chip and the output capacitor (Cout) value can be at least 10× smaller [1]. Therefore, multi-phase current-mode hysteretic DC-DC converters have become a topic of great interest. However, switching frequency synchronization, voltage regulation and current sharing among each phase are challenging. Several state-of-art hysteretic DC-DC converters have been reported to achieve fast transient response [1,3,4]. However, they cannot be synchronized to a reference switching frequency [1], or only cancel the output voltage error induced by the inductor DC resistance (DCR-IE) [4], or are not able to achieve current balancing because the duty cycle is not calibrated for slave phases [1,3].

SUMMARY OF THE INVENTION

The present disclosure describes a digitally controlled point-of-load (POL) direct current to direct current (DC-DC) converter. Embodiments of the converter set new standards for efficiency regulation accuracy in high current-step applications such as powering advanced digital Application Specific Integrated Circuits (ASICs), Field Programmable Gate Arrays (FPGAs), and processors. The ability to maintain tight core and input output (I/O) voltage tolerances at minimum undershoot/overshoot is increasingly critical as supply voltages' tolerances shrink while currents and noise sensitivity increase.

In one embodiment, the DC/DC converter comprises a digital frequency synchronization circuit, including a bang bang phase frequency detector (PFD); a PI compensator connected to the PFD; and a Digital to Analog Converter connected to the PI compensator. An autozeroed comparator (e.g., comprising a comparator pre-amplifier connected to a second stage comparator) has a hysteretic window controlled by output current from the DAC in response a feedback frequency received from the autozeroed comparator. The autozeroed comparator controls the frequency $f_{sw}$, of the input voltage inputted to the DC/DC converter in response to feedback comprising detection of the CCM/DCM boundary at the output of DC/DC converter. The digital frequency synchronization circuit and the autozeroed comparator form a phase locked loop wherein:

the PFD compares the feedback frequency to a clock reference frequency CLK_ref, and outputs a digital signal in response thereto;

the PI compensator increments or decrements the digital signal depending on whether the feedback frequency is greater or less than the CLK_ref; and the DAC's output current is increased in response to receiving the incremented digital signal, thereby increasing the hysteretic window and decreasing $f_{sw}$, and/or the DAC's output current is decreased in response to receiving the decremented digital signal, thereby decreasing the hysteretic window and increasing $f_{sw}$, so that $f_{sw}$ is locked to CLK_ref.

By employing a digital frequency synchronization (DFS) method to tune the hysteretic window, the converter may be synchronized within ±1.5% of the input reference clock and hence shows a fixed switching frequency. In one or more embodiments, the comparator pre-amplifier includes a circuit measuring the input referred offset of the comparator pre-amplifier during a sampling phase and subtracts the measured input referred offset from input referred offset during a settling phase. For example, the pre-amplifier measures, stores (in capacitor in the pre-amplifier), and subtracts the measured input referred offset at each cycle, after a plurality of cycles, or at any fraction of a cycle of $f_{sw}$ and/or in real time with operation of the DC/DC converter. By using the online auto zero (OAZ) topology, the hysteretic comparator input referred offset may be canceled so that converter output voltage error is within ±1% or +/−2% range of the input voltage reference.

While some analog elements may be retained in the circuit, because the output quantity of interest is an output voltage as is the input reference, the use of high speed error-corrected comparators rather than slow "op amp" error amplifiers achieves superior transient response and much superior recovery time from and resilience against single event transient output errors (a key concern for load devices' own reliability and consistency of operation).

Full load efficiency matches commercial competitors even in an inferior "package of convenience" and is optimized by use of phase shedding which cuts switching losses by 25-75% depending on load-point. A 4-phase set of integrated power switch devices is capable of delivering up to 10 A of DC current.

In one or more embodiments, the converter is a multi-phase hysteretic DC/DC converter, comprising a master phase circuit connected to a plurality of slave phase circuits. The converter further comprises a calibration code generator (CCG) circuit and a duty cycle calibration block (DCB) circuit for each of the slave phase circuits.

Each of the CCG circuits:
compares an average current from the slave phase circuit with the average current outputted from the master phase circuit;
outputs a first signal when the average current from the slave phase circuit is higher than the average current from the master phase circuit; and/or
outputs a second signal when the average current from the slave phase circuit is lower than the average current from the master phase circuit.

Each of the DCB circuits:
receives the first signal or the second signal;
outputs a duty cycle signal to each of the slave phase circuits, the DCB circuit decreasing the duty cycle signal in response to the first signal and/or increasing the duty cycle signal in response to the second signal, so that each slave phase circuit is synchronized with the master phase circuit.

By applying a duty-cycle-calibrated delay line (DCC-DL) to implement phase synchronization, the duty cycle of each slave phase is calibrated based on the average current information of the master phase to achieve current balancing so that current mismatch is within ±1% among each phase.

The converter exhibits radiation tolerance to total dose and single event effects when fabricated using RHBD (radiation hardened by design) circuit and layout techniques on a foundry technology (e.g., IBM CMOS 0.18 7 HV).

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

The present disclosure describes a single or multi-phase hysteretic quasi-current-mode DC/DC (e.g., buck) converter. By employing a digital frequency synchronization (DFS) method to tune the hysteretic window, the converter is easily synchronized, e.g., within ±1.5% of the input reference clock, and hence shows a fixed switching frequency. By using an online auto zero (OAZ) topology, the hysteretic comparator input referred offset is canceled so that converter output voltage error is, e.g., within ±1% of the input voltage reference. By applying a duty-cycle-calibrated delay line (DCC-DL) to implement phase synchronization, the duty cycle of each slave phase is calibrated based on the average current information of the master phase to achieve current balancing so that current mismatch is within ±1% between each phase.

1. Digital Frequency Synchronization

Figure 1A:
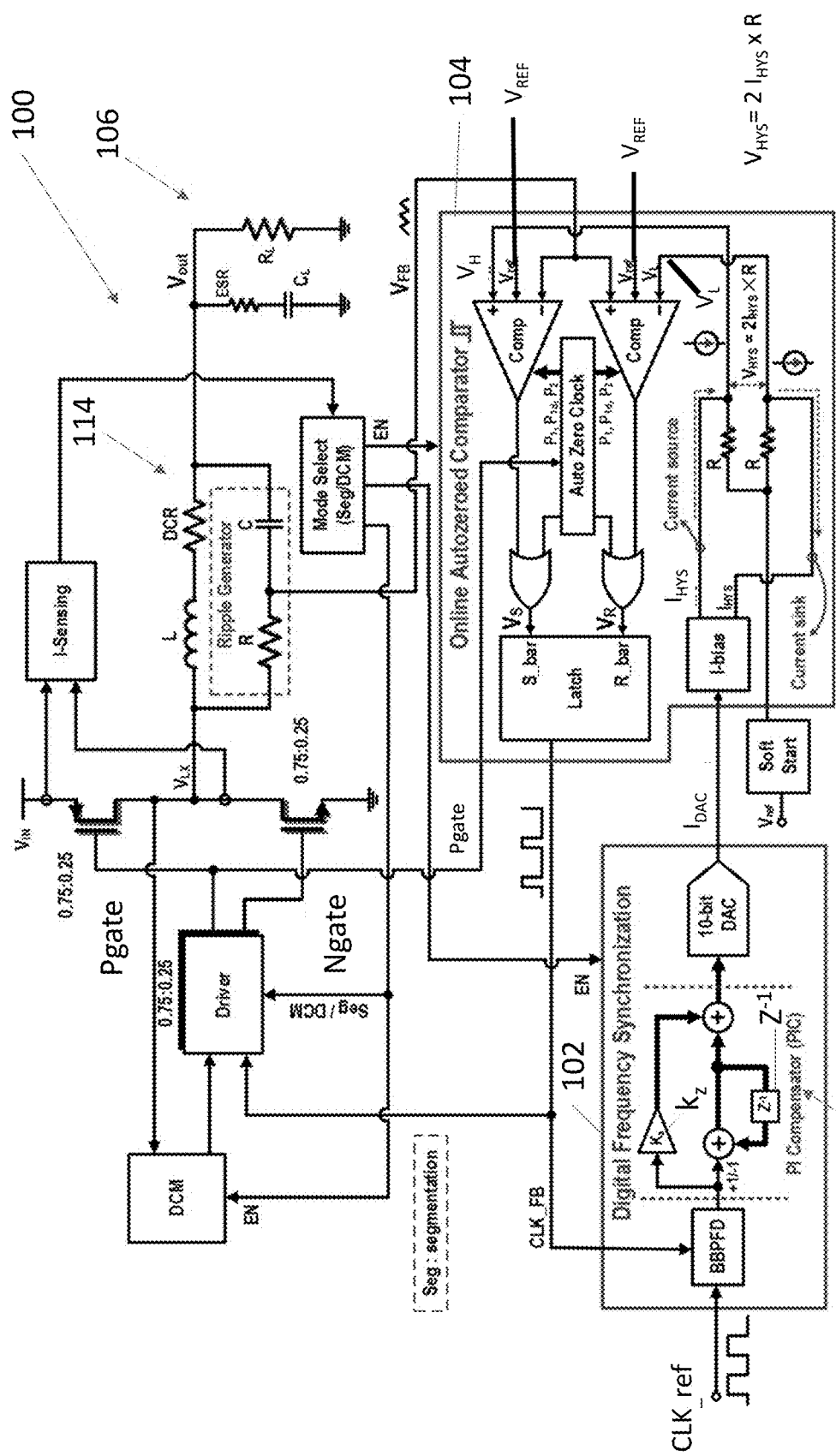
FIG. 1A is a master phase block diagram illustrating the digital frequency synchronization operation principle and FIG. 1B illustrates the digital phase locked loop, according to one or more embodiments of the present invention.

FIG. 1A illustrates a DC/DC converter 100 comprising a digital frequency synchronization circuit 102 connected to an autozeroed comparator 104.

The digital frequency synchronization circuit 102 comprises a bang bang phase frequency detector BBPFD; a proportional integral (PI) compensator (PIC) connected to the BBPFD; and a Digital to Analog Converter (DAC) (e.g., 10 bit DAC) connected to the PIC.

The autozeroed comparator 104 has a hysteretic window controlled by output current $I_{HYS}$ from the DAC in response a feedback frequency (e.g., clock feedback CLK_FB) received from the autozeroed comparator 104. The autozeroed comparator 104 detects a continuous current mode (CCM)/discontinuous current mode (DCM) boundary during operation of the DC-DC converter 100.

The autozeroed comparator 104 controls the frequency $f_{sw}$ of the input voltage $V_{IN}$ inputted to the DC/DC converter 100, in response to feedback comprising detection of the CCM/DCM boundary (as measured by feedback voltage $V_{FB}$) at an output 106 of the DC/DC converter 100.

Figure 1B:
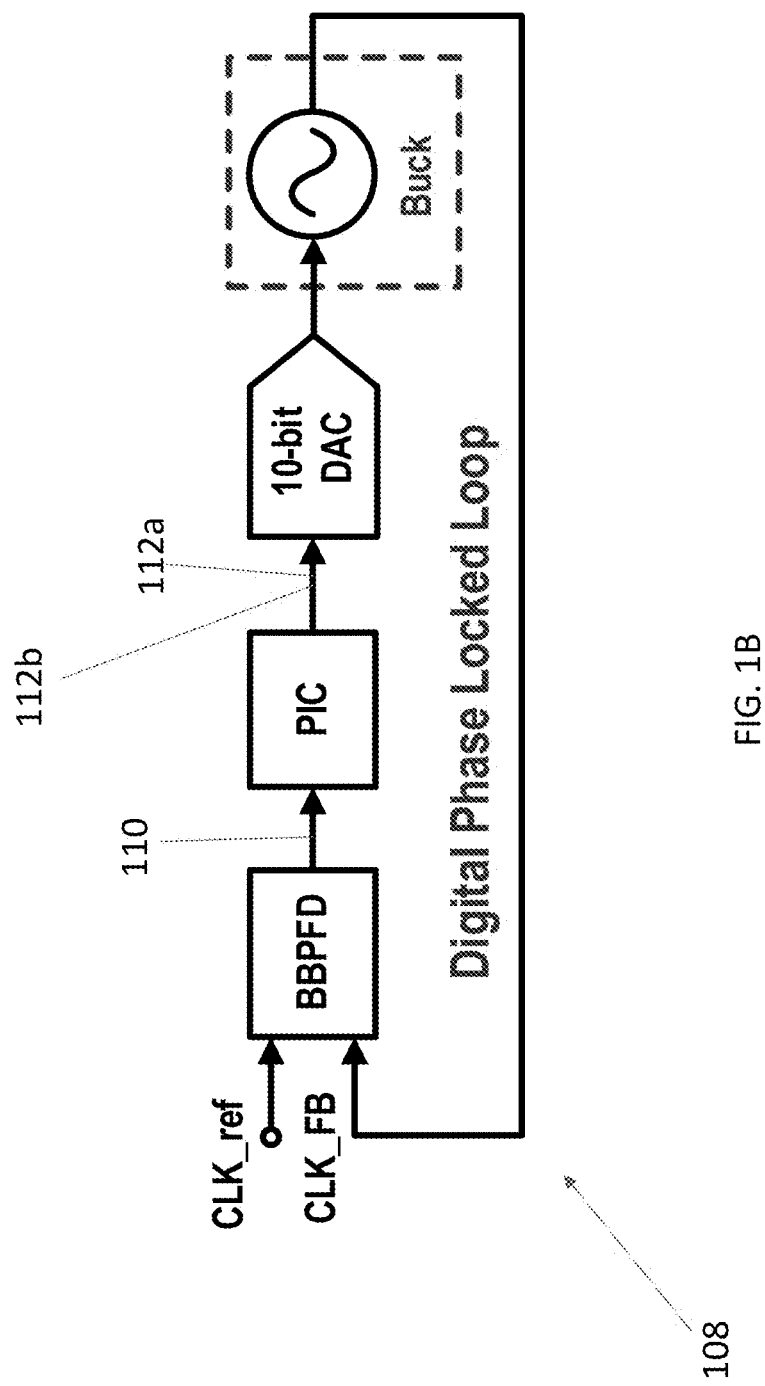

FIG. 1B illustrates the digital frequency synchronization circuit 102 and the autozeroed comparator 104 form a phase locked loop 108 wherein the bang bang phase frequency detector (BBPFD) compares the feedback frequency CLK_FB to a clock reference frequency CLK_ref and outputs a digital signal 110 in response thereto. The PI compensator PIC increments the digital signal 110 if the feedback frequency CLK_FB is greater than the CLK_ref. or decrements the digital signal 110 if the feedback frequency CLK_FB is less than the CLK_ref. The frequency $f_{sw}$ is locked to CLK_ref (e.g., $f_{sw}$ is synchronized, shifted, or maintained to a frequency within 1.5% of CLK_ref) when (1) the DAC's output current $I_{DAC}$ is increased in response to receiving the incremented digital signal 112a, thereby increasing the hysteretic window and decreasing $f_{sw}$ and $V_{IN}$, or (2) the DAC's output current $I_{DAC}$ is decreased in response to receiving the decremented digital signal 112b, thereby decreasing the hysteretic window and increasing $f_{sw}$ and $V_{IN}$.

In the quasi-current-mode control, the RC time constants of capacitor C and resistor DCR in circuit 114 do not need to be equal to L/DCR (where L is inductance of inductor L). Instead, circuit 114 only provides ripple which is needed for the hysteretic comparator 104 to operate. Rather than using the digital controlled delay line to tune the loop delay [5] or a feedback resistor array in parallel with the inductor to change the RC time constants [4], the hysteresis window of the comparator 104 is adjusted by the output current $I_{HYS}$ of the 10-bit current-steering DAC. Considering the hysteretic buck converter 100 as a current-controlled oscillator (CCO), its switching frequency ($f_{sw}$) will be locked to the desired input reference clock ($f_{ref}$ or CLK_REF) when the digital phase locked loop (DPLL) comes to the steady state. Compared to the traditional charge-pump PLL (CPLL), the low frequency pole and the compensation zero are generated by the accumulator and the feedforward gain respectively. Therefore, no bulky compensation capacitor is needed as in CPLL.

FIG. 1C illustrates an example where $f_{sw}$, (CLK_ref) is faster than $f_{ref}$, the bang-bang PFD's output is 1, resulting in the digital code of the accumulator incremented by (k+1) at each clock period. As a result, the DAC's output current $I_{DAC}$ is increased and the hysteresis window is enlarged, slowing $f_{sw}$, down during transitions [$t_1$–$t_3$] until it is locked to $f_{ref}$ (as shown in transitions [$t_4$–$t_6$]). In one or more high power efficiency embodiments, the driver 116 and the power FET 118 are both segmented with a ratio of 3:1 so that the converter 100 is able to enter into the segmentation and burst mode at light load condition (meanwhile, the DFS function is also disabled and let the load current determines the switching frequency which may be less than several kHz).

Figure 2A:
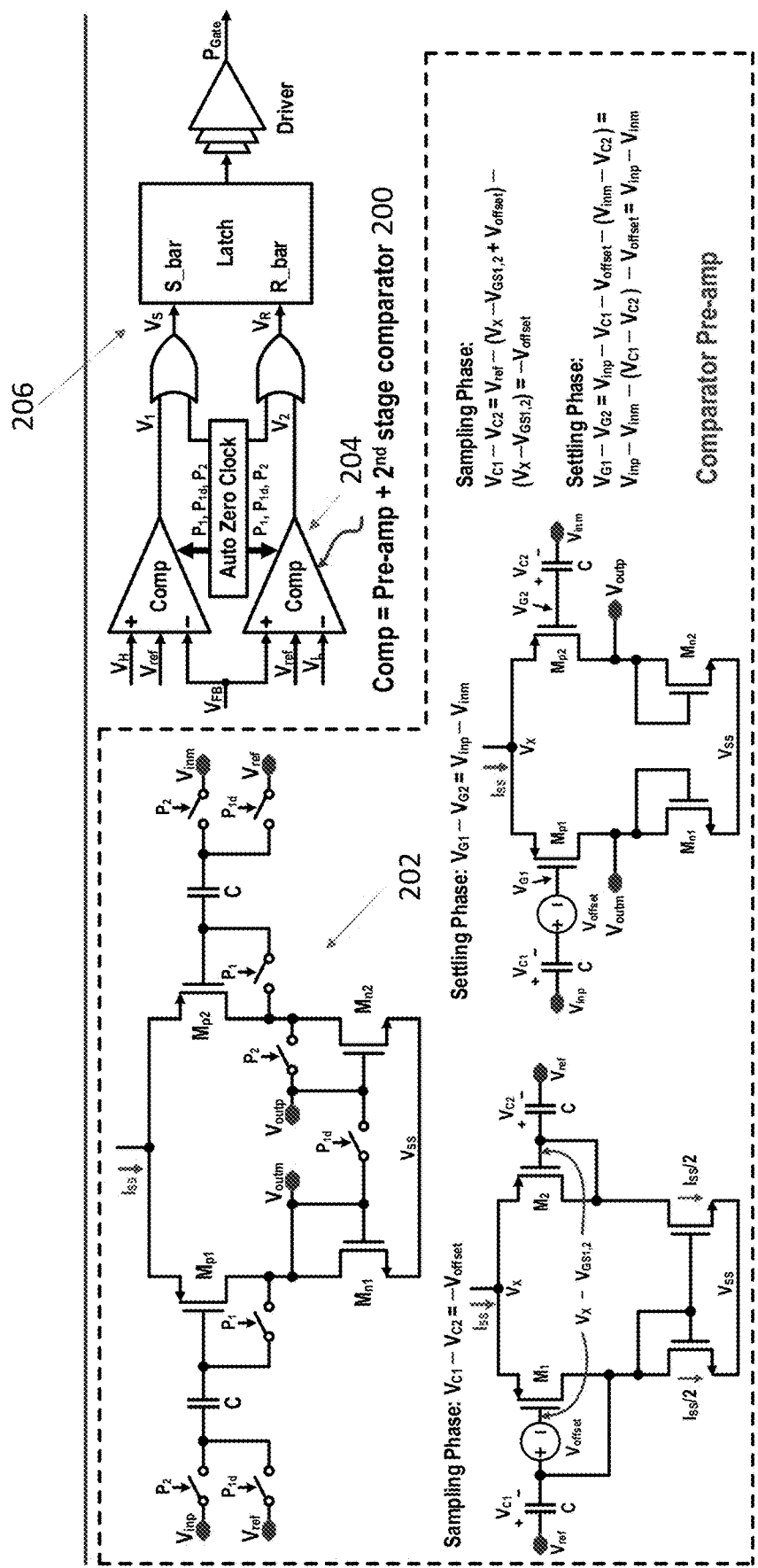
FIG. 2A illustrates the hysteresis comparator pre-amp structure and operation principle.
Figure 2B:
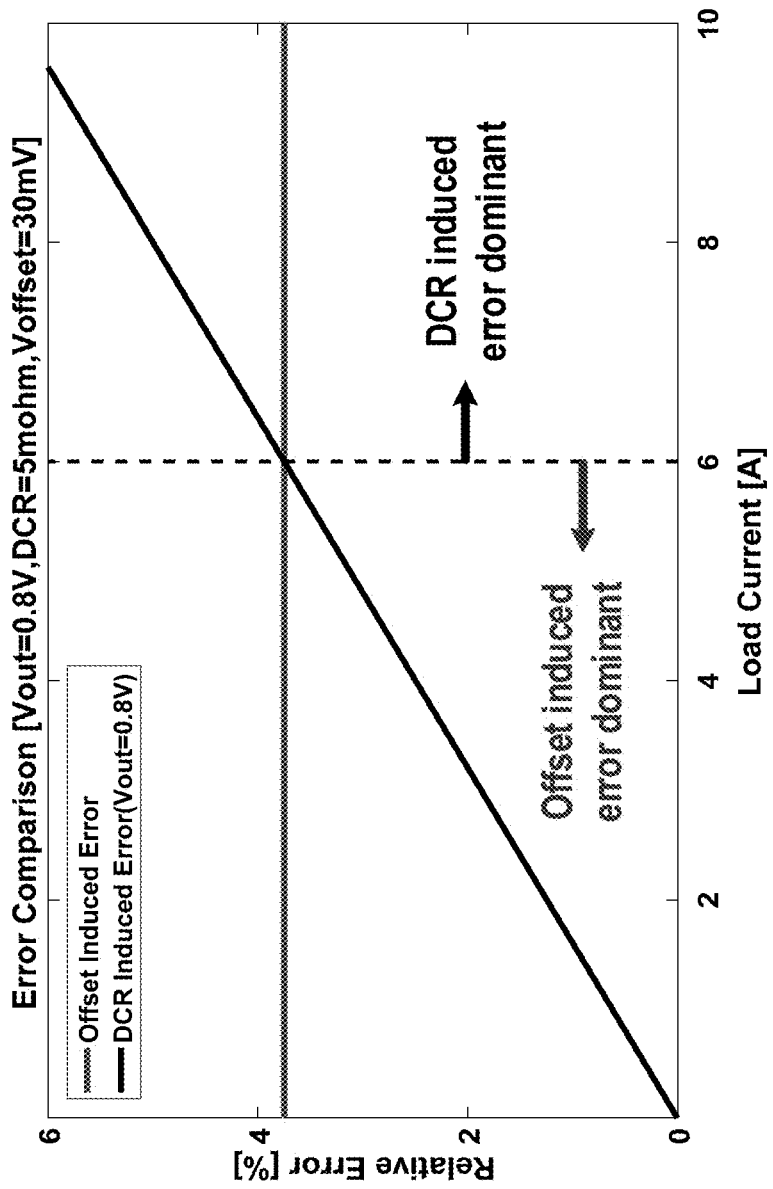
FIG. 2B illustrates offset induced error and DCR induced error regimes.
Figure 2C:
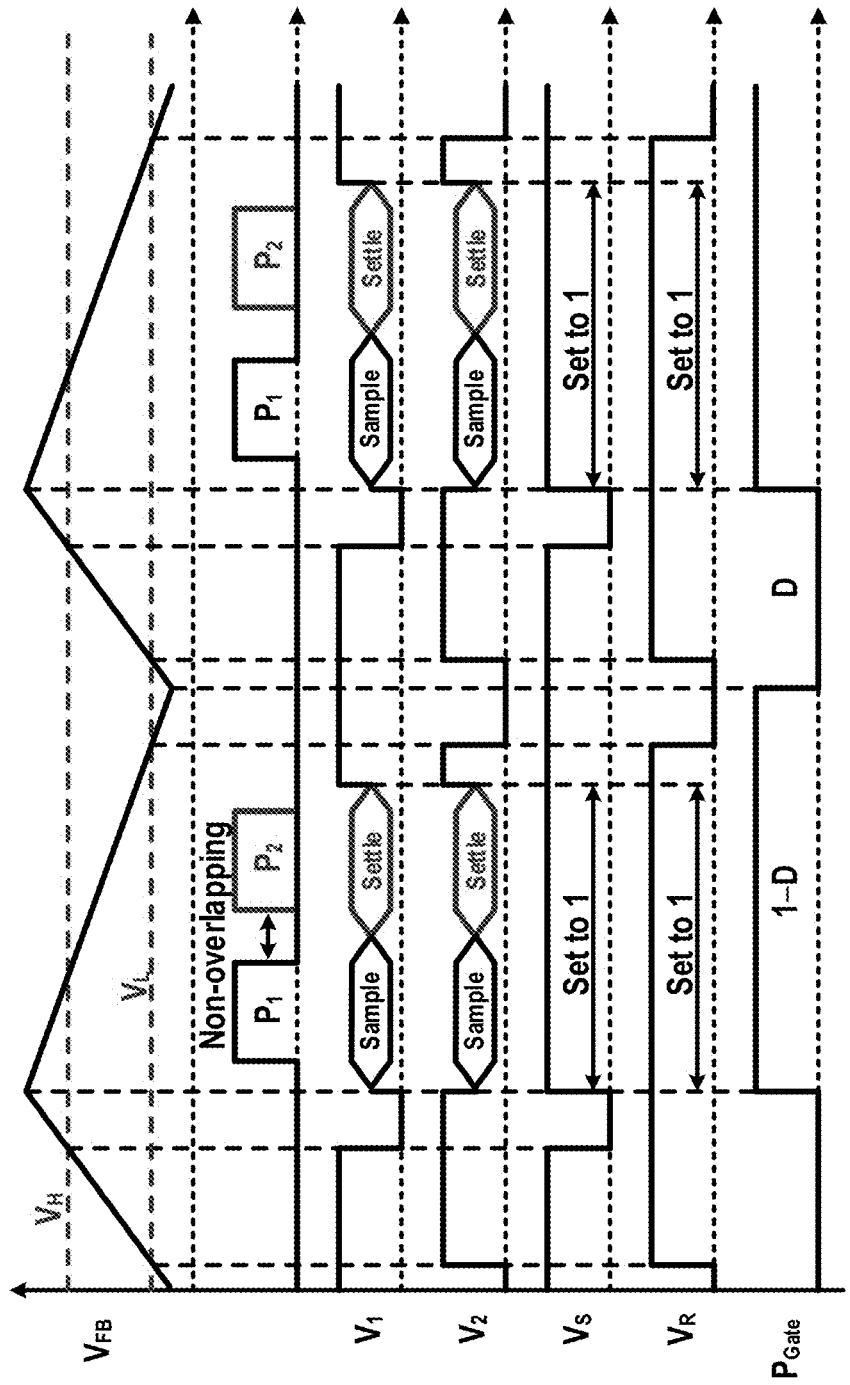
FIG. 2C illustrates an online auto-zero timing sequence, according to one or more embodiments of the present invention.

As illustrated herein, implementation of the digital control loop demonstrated excellent transient response with relatively light output filtering. Traditional (and presently available) RH POLs all use analog control loops which impose limitations on loop corner frequency relative to switching frequency. Digital control can break this performance-limiting linkage and provides a superior stability-vs-slew-capability tradeoff 2. Online Autozeroed Comparator Operation For hysteretic control topology, the output voltage error of the converter mainly comes from the DCR-IE and the hysteretic comparator offset induced error (O-IE). Other work has reported canceling DCR-IE by connecting one of the hysteretic comparator's inputs to buck converter's output during each switching period [4]. However, the DCR-IE reduces linearly with the load current while the O-IE remains the same. In one example, the DCR is 5 mΩ, the output voltage is 0.8V and the hysteretic comparator input referred offset is 30 mV. As shown in FIGS. 2A-2C, the boundary condition of the load current is 6 A when DCR-IE and O-IE are equal. Therefore, in an application which the maximum load current is 6 A, the O-IE must be canceled instead of the DCR-IE in order to achieve accurate voltage regulation.

The hysteretic comparator 200 has two sub comparators which are used to compare the hysteretic window ($V_H$ and $V_L$, where $V_H$ is the highest voltage in the hysteretic window and $V_L$ is the lowest voltage in the hysteretic window) with the feedback voltage ($V_{FB}$). Each sub comparator contains/comprises a pre-amp 202 and an OTA-based comparator (OBC) as the second stage 204. Considering the input referred offset of the second stage will be divided by the gain of the pre-amp, the OAZ topology only cancels the pre-amp input referred offset.

More specifically, the comparator pre-amplifier 202 includes a circuit measuring the input referred offset of the comparator pre-amplifier 202 during a sampling phase and subtracts the measured input referred offset $V_{offset}$ from input referred offset during the settling/operation phase. The inverse of the measured input referred offset is stored on capacitors C and added across the inputs (across Vref and $V_H$ and/or across Vref and $V_L$) in the settling/operation phase.

During the sampling phase, $M_{n1}$ and $M_{n2}$ forms a current mirror so that the current flowing through $M_{p1}$ and $M_{p2}$ are equal. The same gate-to-source voltage is obtained ($V_{GS1,2}$) and the offset is sampled on the input capacitor $C_1$ and $C_2$ so that the offset is cancelled during the settling phase. Considering $V_{outp}$ and $V_{outm}$ are connected together during the sampling phase, the input referred offset of the OBC may cause its output to be 0. To avoid the false triggering of the RS-Latch, two OR gates are used to set $V_S$ and $V_R$ to 1 respectively during both the sampling and the settling phase. A non-overlapping clock and bottom-plate sampling method are used to generate the auto zero clock ($P_1$, $P_{1d}$ and $P_2$). Thus, the autozeroed comparator 200 further comprises capacitors C to store the output voltage error and/or the measured input offset error used to cancel the input offset error of the comparator 200, 204. In one or more embodiments, the pre-amplifier 202 measures and subtracts the measured input referred offset across the inputs (across Vref and $V_H$ and/or across Vref and $V_L$) of the pre-amplifier 202 at each cycle/period of $f_{sw}$ (or after any number of periods or fractions of a period) and/or in real time with operation of the DC/DC converter, as needed.

In one or more embodiments, the input referred offset is canceled so that the converter's output voltage error is within 2% of the converter's input voltage.

3. Multi-Phase Circuit

Multiphase (4-phase) operation effectively increases (e.g., quadruples) the output ripple frequency and reduces (e.g., quarters) its amplitude. A smaller output filter capacitance may also be enabled using multiphase operation.

Figure 3A:
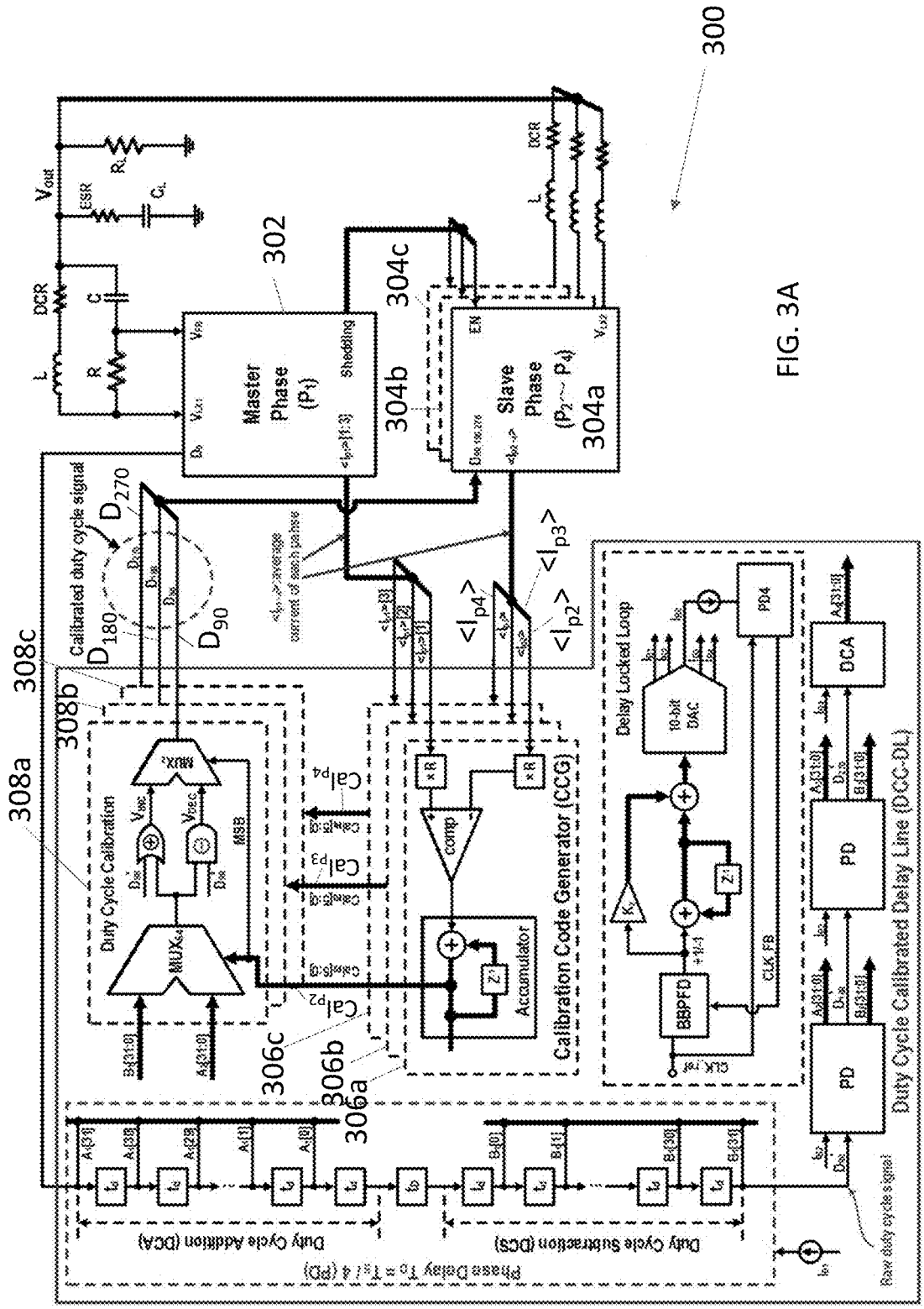
FIG. 3A illustrates a 4-phase hysteretic buck converter with current sharing control and phase-shedding mode.

FIG. 3A is a complete multiphase (4-phase) hysteretic DC/DC (buck) converter block diagram. The DC/DC converter 300 comprises one master phase circuit 302 (including DFS circuit and autozeroed comparator) connected to a plurality (three) slave phase circuits 304a, 304b, and 304c which are synchronized with the master phase circuit 302 using calibration code generators (CCG) 306a, 306b, 306c, duty cycle calibration blocks 308a, 308b, 308c, and a duty-cycle-calibrated delay line (DCC-DL) creating phase delay (PD).

The converter 300 comprises a separate comparison (CCG) circuits 306a, 306b, 306c connected to each one of the slave phase circuits 304a, 304b, 304c). Each of the CCG circuits 306a, 306b, 306c:
  compare an average current $<I_{p2}>$, $<I_{p3}>$, or $<I_{p4}>$ of the slave phase circuit 304a, 304b, or 304c connected to the CCG circuit 306a, 306b, 306c with the average current $<I_{p1}>$ outputted from the master phase circuit 302;
  output a first comparison signal $Cal_{p2}$, $Cal_{p3}$, or $Cal_{p4}$, when the average current $<I_{p2}>$, $<I_{p3}>$, or $<I_{p4}>$ in the slave phase circuit 304a, 304b, 304c connected to the CCG circuit 306a, 306b, 306c is higher than the average current in the master phase circuit; and
  output a second comparison signal $Cal_{p2}$, $Cal_{p3}$, or $Cal_{p4}$ when the average current $<I_{p2}>$, $<I_{p3}>$, or $<I_{p4}>$ in the slave phase circuit 304a, 304b, 304c connected to the CCG circuit 306a, 306b, 306c is lower than the average current $<I_{p1}>$ in the master phase circuit 302.

Thus, the comparison circuits 306a, 306b, 306c each output a comparison signal $Cal_{p2}$, $Cal_{p3}$, or $Cal_{p4}$ representing the difference between the slave average current and the master average current, for each of the slave phase circuits, The duty cycle calibration block (DCB) circuits 308a, 308b, and 308c (a separate DCB circuit connected to each one of the CCG circuits 306a, 306b, 306c and each one of the slave circuits 304a, 304b, 304c):
  receive the first comparison signal $Cal_{p2}$, $Cal_{p3}$, or $Cal_{p4}$ or the second comparison signal $Cal_{p2}$, $Cal_{p3}$, or $Cal_{p4}$ from the comparison (e.g., CCG) circuit 304a, 304b, or 304c connected to the DCB circuit 308a, 308b, and 308c; and
  in response to receiving the comparison signal $Cal_{p2}$, $Cal_{p3}$, or $Cal_{p4}$, output a duty cycle signal $D_{90}$, $D_{180}$, or $D_{270}$ to the slave phase circuit 304a, 304b, 304c connected to the DCB circuit 308a, 308b, or 308c, the DCB circuit 308a, 308b, or 308c decreasing the duty cycle signal $D_{90}$, $D_{180}$, or $D_{270}$ in response to the first signal $Cal_{p2}$, $Cal_{p3}$, or $Cal_{p4}$ and increasing the duty cycle signal $D_{90}$, $D_{180}$, or $D_{270}$ in response to the second signal $Cal_{p2}$, $Cal_{p3}$, or $Cal_{p4}$, so that each slave phase circuit 304a, 304b, 304c is synchronized with the master phase circuit 302.

This approach mitigates the challenges due to current sharing, thermal management and reliability associated with the multi-phase DC-DC converter. Unlike [1], rather than adopting the raw duty cycle signal directly to the slave phases, the DCA block, duty cycle subtraction (DCB) block, duty cycle calibration (DCC) block and calibration code generator (CCG) block are designed to calibrate the raw duty cycle and achieve current sharing without affecting the phase synchronization timing sequence. In one or more embodiments, the CCG block compares the average current of each slave phase with that of the master phase and produces a 5-bit digital calibration code for the 64-input mux ($MUX_{64}$) to select one of the signals either from DCA or DCB block. The OR gate and the AND gate increases or decreases duty cycle by applying $MUX_{64}$'s output to the raw duty cycle signal.

Figure 3B:
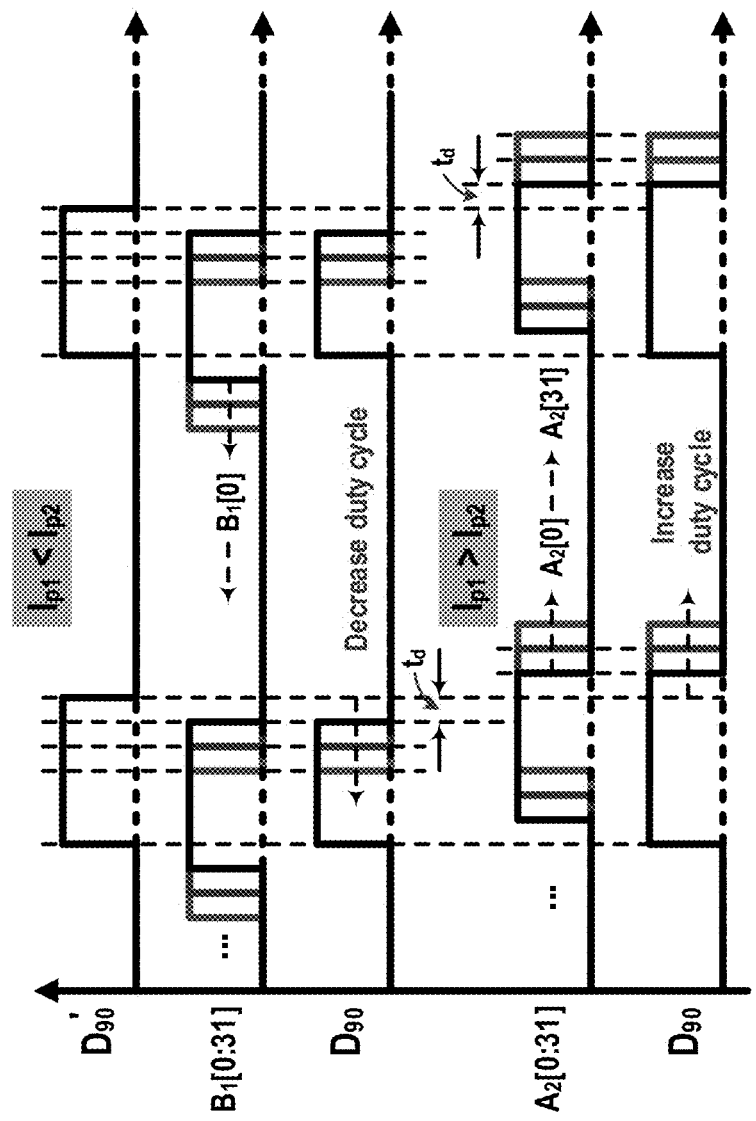
FIG. 3B illustrates duty cycle modification, according to one or more embodiments of the present invention.

The operation principle according to one or more embodiments can be further explained using the waveforms that are shown in FIG. 3B. Assuming $I_{p2}$ is larger than $I_{p1}$ as the waveform shown in FIG. 3B, $MUX_{64}$ will choose $B_1[0]$ as its output and $MUX_2$ will choose $V_{DEC}$ as its output. In this case, the AND gate is used for decreasing the raw duty cycle signal of phase 2 by the amount of $t_d/T_S$. With the decreased the duty cycle signal, if $I_{p2}$ is still larger than $I_{p1}$ for the next several clock cycles, $B_1[1]$ is chosen for decreasing the duty cycle by the amount of $2 \times t_d/T_S$. This process will continue until $I_{p1}$ is equal to $I_{p2}$. On the other hand, if $I_{p2}$ is smaller than $I_{p1}$, $MUX_{64}$ will choose one of the signals from $A_2[31:0]$ as its output and $MUX_2$ will choose $V_{INC}$ as its output. In this case, the OR gate is used for increasing the raw duty cycle with the amount determined by the CCG's digital code output. The same process will continue for the remaining slave phases until the average current between each slave phase circuit and the master phase circuit are balanced. During the process of calibrating the raw duty cycle signal for each slave phase, the rising edge of the raw duty cycle signal remains the same so that the phase synchronization timing sequence is not affected. In one or more embodiments, the duty cycle signals reduce the difference to within 2% of the slave average current and/or reduces a phase mismatch between the phases to within 10%. In one or more high power efficiency embodiments, the master phase will shut down one or more of the slave phases and enter into the phase shedding mode based on the average current sensed from the high-side and lowside power FET (e.g., when the load current is below a threshold value). Phase shedding directly cuts switching losses at lighter loads where these become the dominant loss term. For example, by dropping 3 of the 4 phases at the point where switching losses become a significant portion of overall efficiency, substantial improvements in lower load range efficiency are realized. Beyond this point a seamless transition to DCM (discontinuous conduction mode) further reduces switching losses at very low power output demand.

4. Results

The 4-phase hysteretic buck converter of FIG. 3A was fabricated in a 0.18 μm 5V CMOS process from IBM as described in section 5. The fabricated chip performance was characterized as follows.

a. Frequency Synchronization

Figure 4:
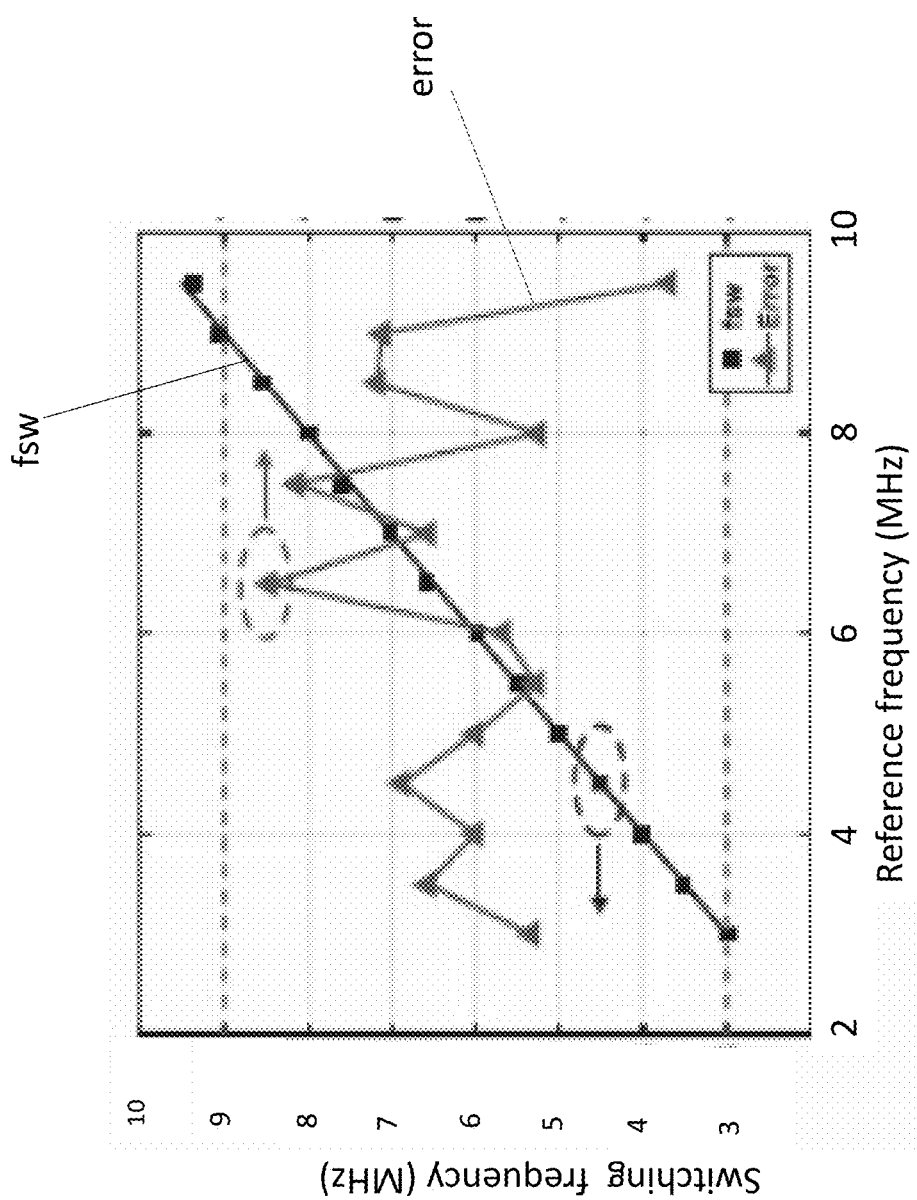
FIG. 4 plots switching frequency as a function of reference frequency, according to one or more embodiments of the present invention.
Figure 5A:
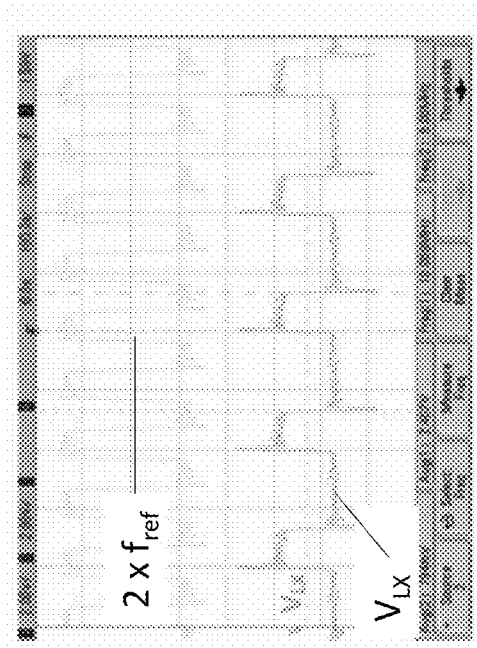
FIGS. 5A-5D plot measured input clock reference and $V_{LX}$ waveforms (representing the switching frequency fsw) for frequency synchronization, according to one or more embodiments of the present invention.
Figure 5B:
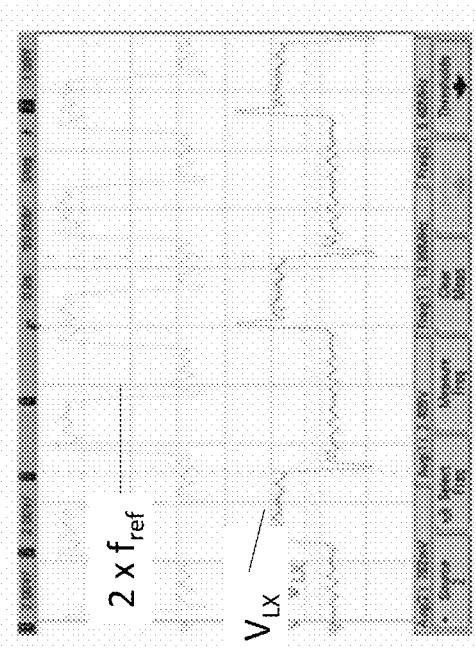
Figure 5C:
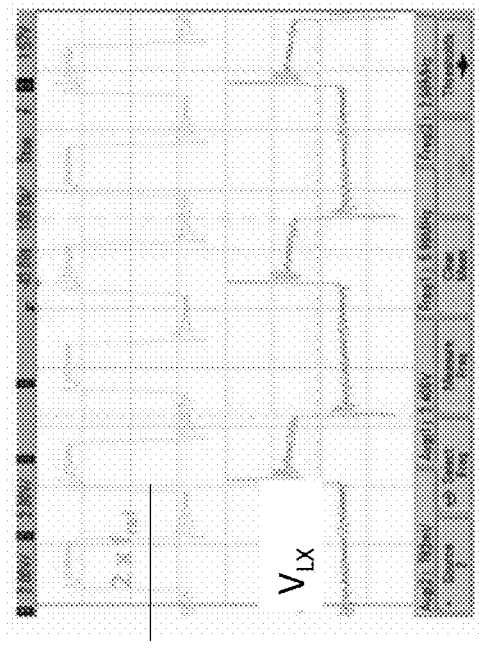
Figure 5D:
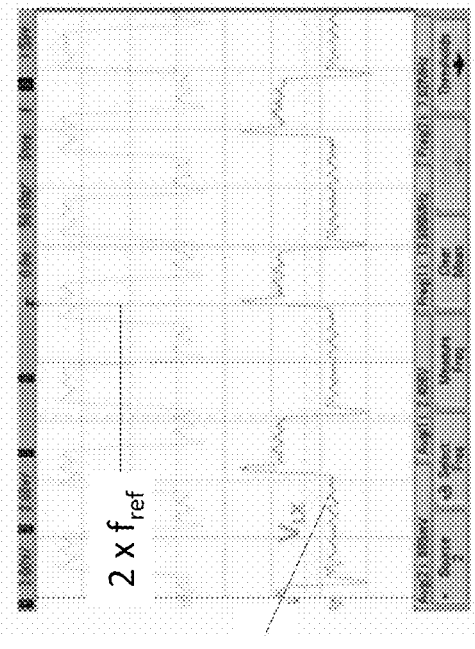

As shown in FIG. 4, the switching frequency can be synchronized with the input reference clock frequency with a maximum error less than ±1.5% in the range of 3~9.5 MHz. FIGS. 5A-5D plot the measured input clock reference and $V_{LX}$ waveforms for frequency synchronization.

b. Canceled Hysteretic Comparator Offset

Figure 6:
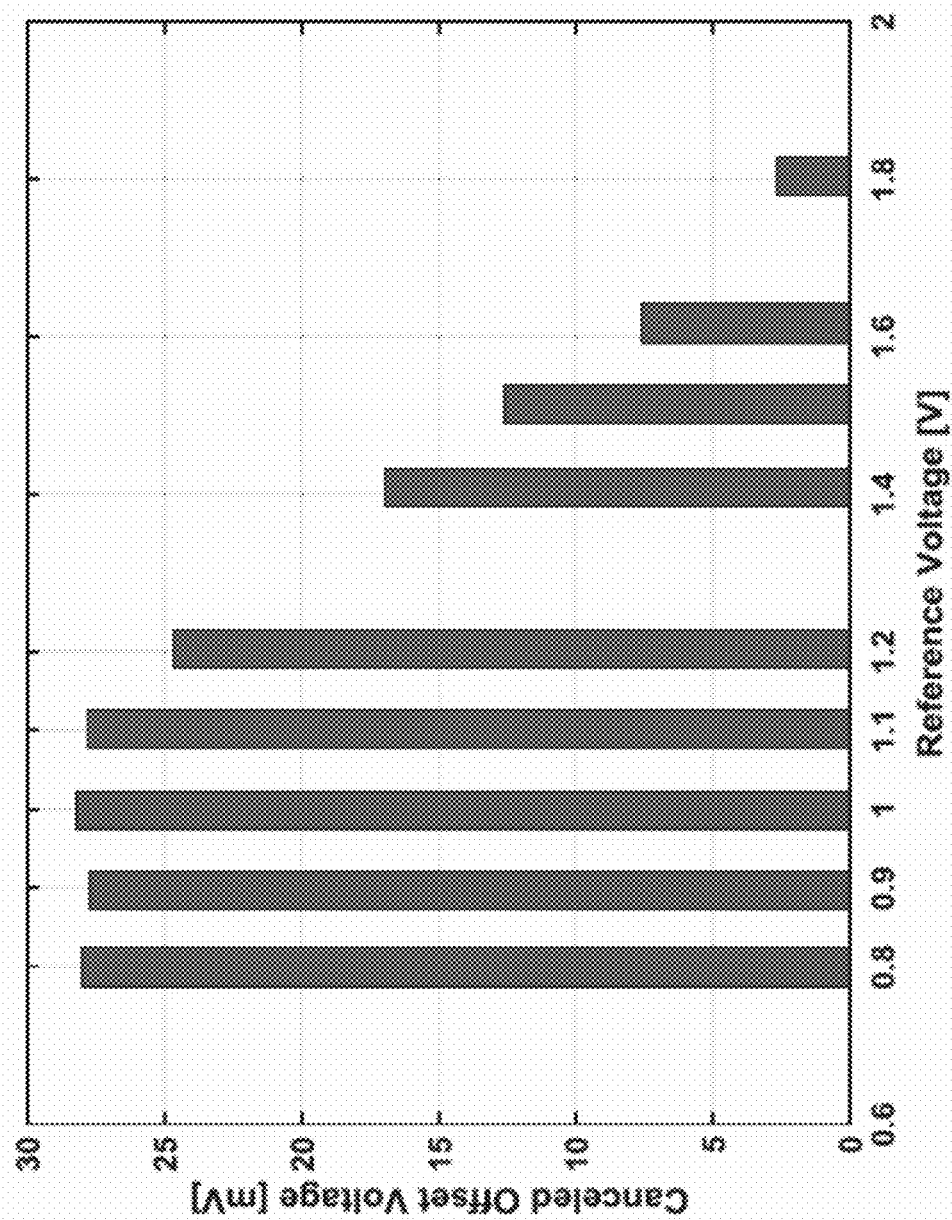
FIG. 6 plots result of measurement of cancelled hysteretic comparator offset by online auto zero topology, according to one or more embodiments of the present invention.
Figure 7:
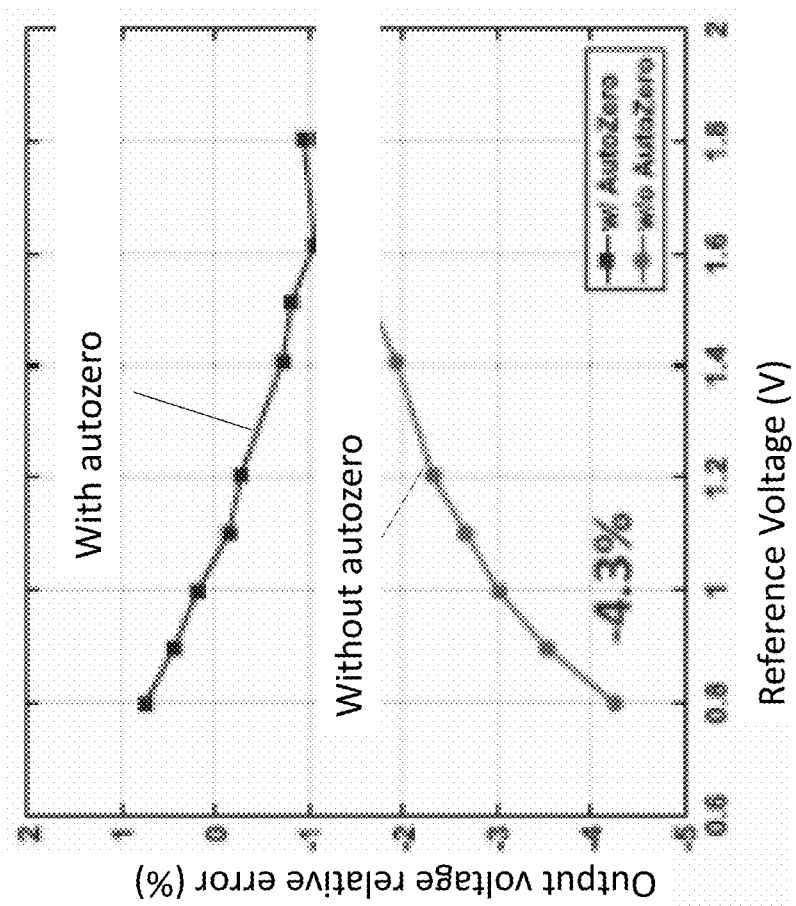
FIG. 7 plots output voltage relative error as a function of reference voltage, according to one or more embodiments of the present invention FIG. 8 plots measurement of steady-state waveforms when the converter works in the 4-phase operation mode, according to one or more embodiments of the present invention

FIG. 6 shows measurement of canceled hysteretic comparator offset using the online autozero topology of FIGS. 1-2 and FIG. 7 shows OAZ control enables a 4 times reduction of output voltage error.

c. Current Balancing

Figure 8:
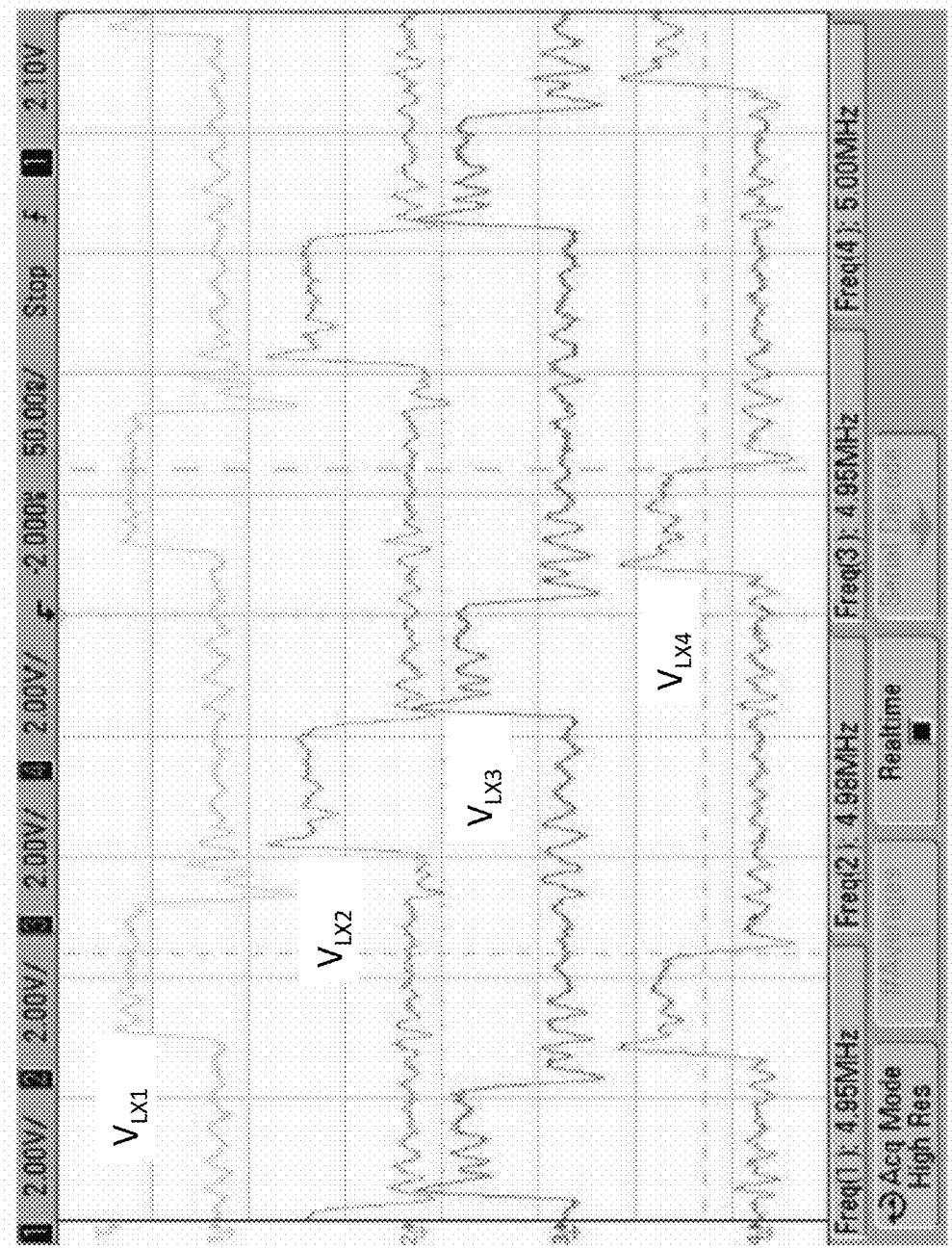

The measured inductor current waveforms shown in FIG. 8 demonstrate that current balancing is achieved with maximum current mismatch between each phase less than ±1.5%.

d. Transient Response

Digital loads are capable of presenting rapidly changing current demands to their power supply. The difference between maximum Ida and minimum Ida can be nearly full-scale.

Figure 9:
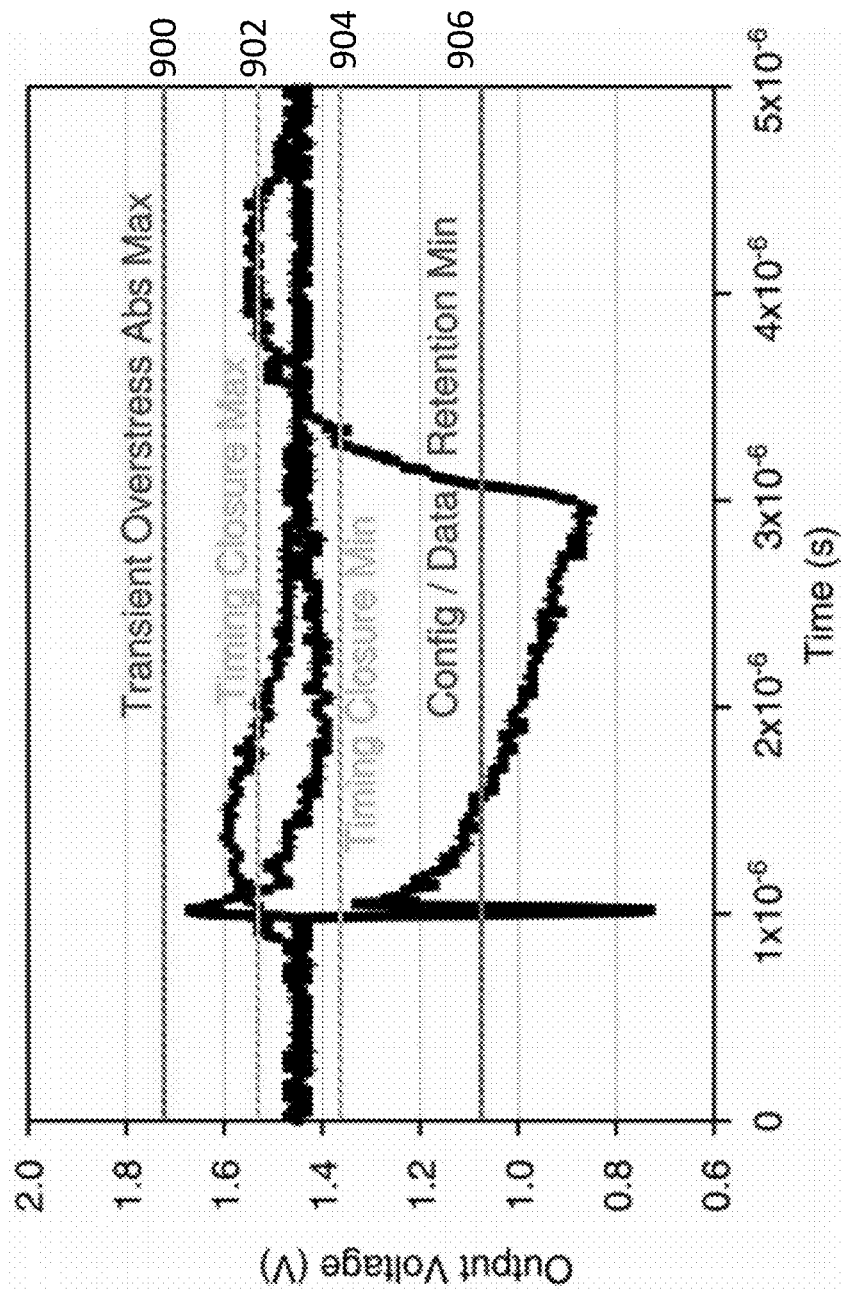
FIG. 9 illustrates example power supply tolerance bands, showing transient overstress absolute maximum 900, timing closure maximum 902, timing closure minimum 904, and config/data retention minimum 906.

High performance digital components (FPGAs, ASICs, processors, memories) depend on power supply integrity in order to maintain signal integrity. Deviations from specified supply tolerance can impact timing and cause functional problems. High speed serial bus resources are especially demanding in this respect, as their timing directly impacts bit error rate. FIG. 9 shows the typical tolerances required by devices that can be powered with the chip design of FIG. 3A.

Figure 10A:
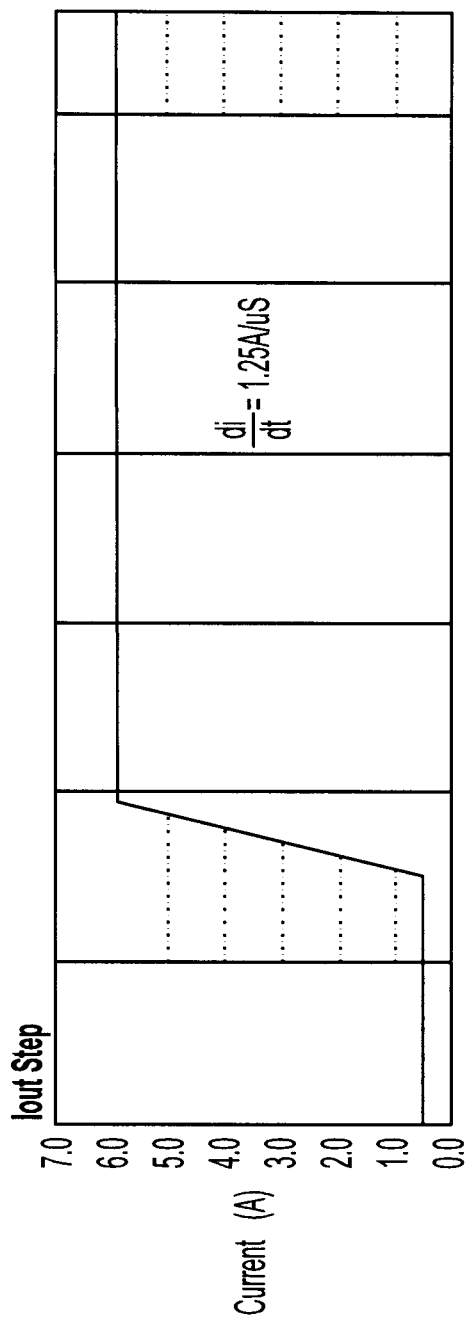
FIG. 10 illustrates commercial Rad Hard POL converter load-step response.
Figure 10B:
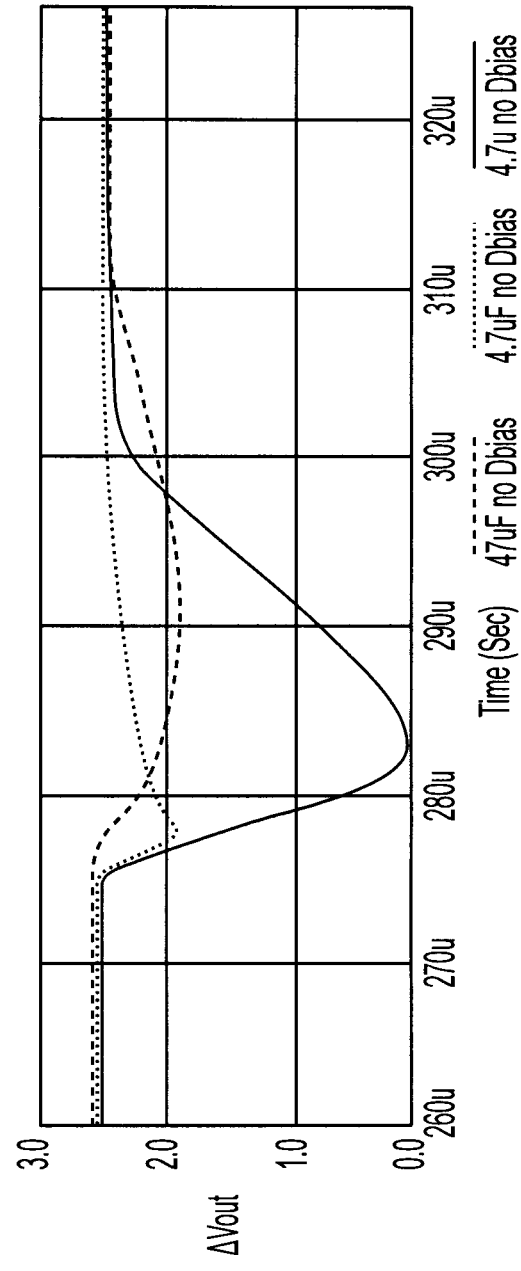

FIG. 10 shows an industrial rad hard POL [6] demonstrating a significant transient perturbation under load-step conditions which are not especially aggressive (abrupt). A traditional analog control loop exhibits substantial (>500 mV) deflection under moderate step-load slew rates. Note how the best-case configuration's −500 mV load-dip, if applied to a lower voltage set-point, would undershoot the data retention voltage as well as violate design timing integrity limits of a lower voltage part as shown in FIG. 9.

Figures 11A, 11B:
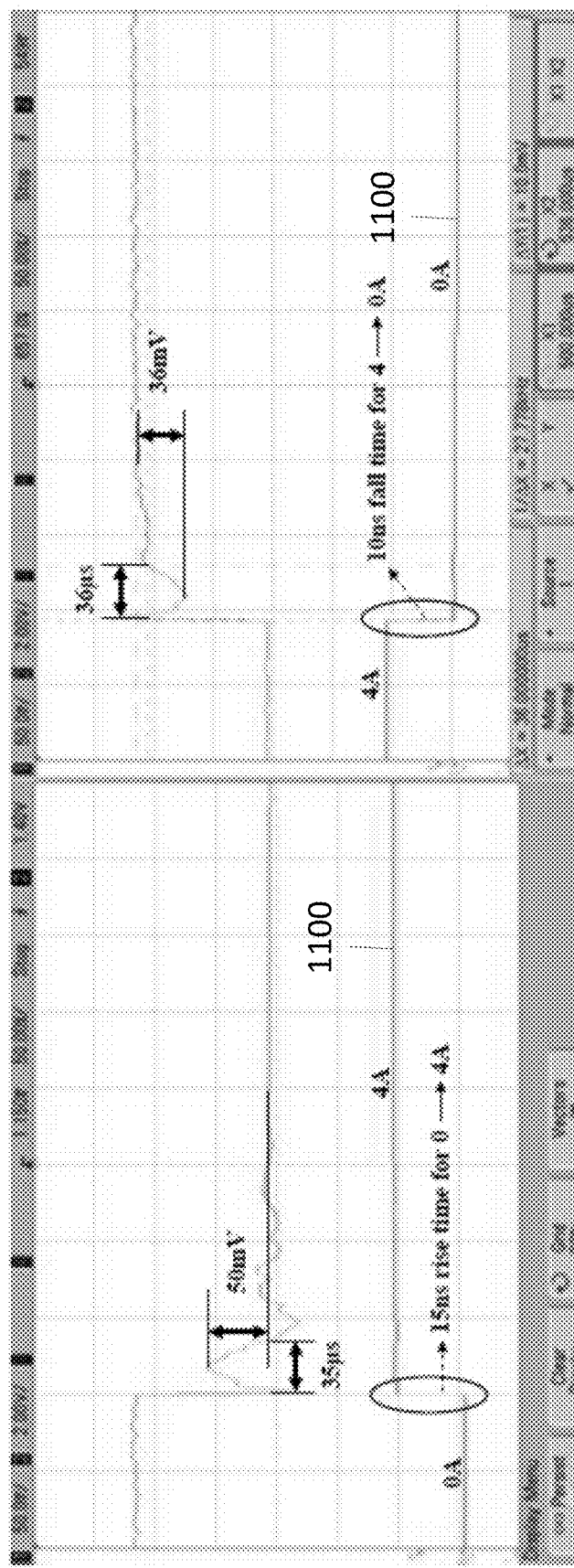
FIGS. 11A-11B plot the digital control loop feedback load step response achieved using one or more embodiments of the present invention.

The digital control loop of FIG. 1A, on the other hand, achieves ⅕ the deflection when challenged with 100× the current slew rate (dI/dt). FIGS. 11A-11B show the output deviation (50 mV/div) for 4 A load steps slewing at 1 A/10 nS that can be achieved using the circuit of FIG. 1A. Also notable is that a 4 A load dump produces no significant overshoot, such as might damage sensitive core devices. For the example part shown in FIG. 9, this is only +200 mV from nominal and, if the commercial part response were symmetric for the load-dump case (not shown in the source material), this limit would be violated as well, possibly with destructive results.

The settling time from the load excursion is also notably shorter than analog control loops can achieve. In FIGS. 11A-11B, a 0-4 A load step (FIGS. 11(a)) and 4-0 A load step (FIG. 11B) are applied through a switched FET load (green traces 1100). The current rise/fall times are in the 10-15 ns range, which is far more abrupt than a well-decoupled digital part would impose. The yellow traces are the output voltage (set-point=1.00V) on a 50 mV/div vertical scale and a 50 uS/div horizontal time-base. Compared to FIG. 10, the amplitude of deflection is ½ of what a well-tuned analog loop achieves under similar conditions (filter capacitance and step magnitude) despite a much faster applied edge rate on the digital part.

Thus, the unique digital control loop architecture of FIG. 1A provides surprisingly excellent transient response without sacrificing efficiency, while requiring much less input and output filter capacitance than commercial competitors (tens, rather than hundreds of micro-farads, because the circuit of FIG. 1A is not operational amplifier based, but uses fast digital/mixed-signal methods).

e. Efficiency

Figure 12A:
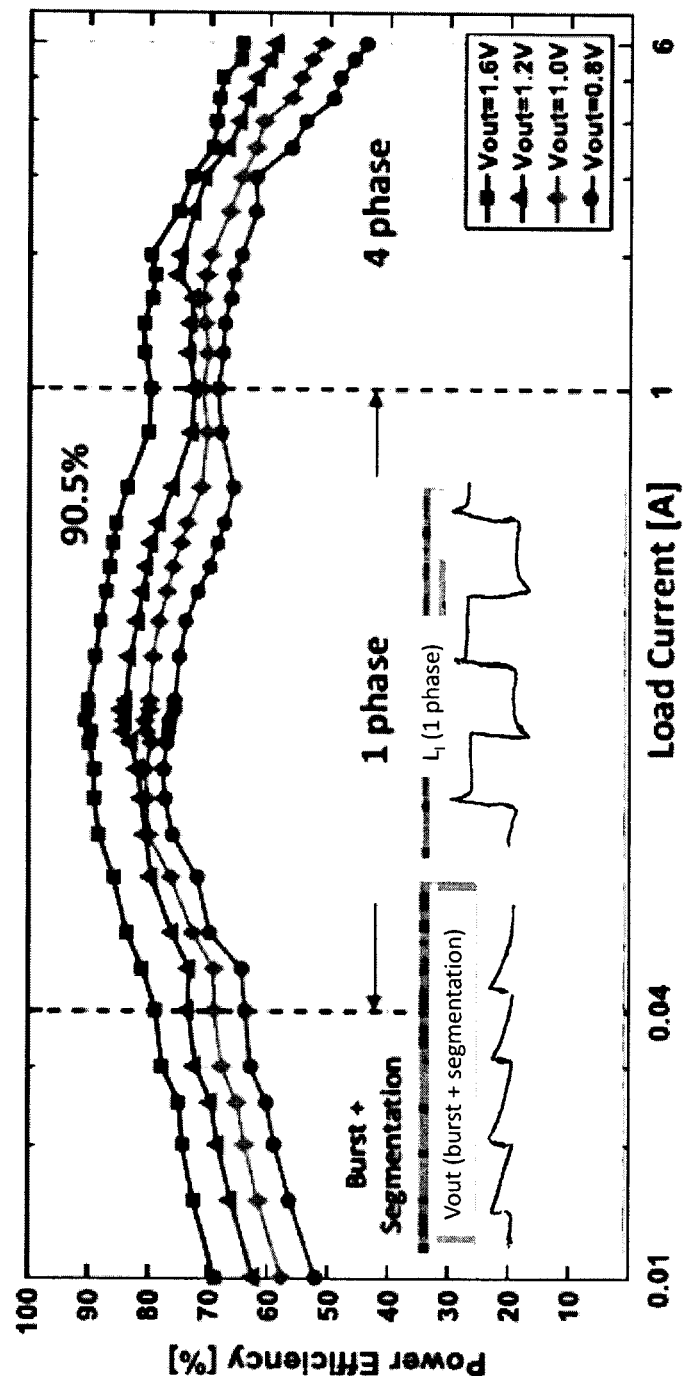
FIG. 12A plots measured efficiency versus load current under different output voltages, according to one or more embodiments of the present invention FIGS. 12B-12E plot measured efficiency versus load current in different operation modes and different operation voltages, according to one or more embodiments of the present invention.
Figure 12C:
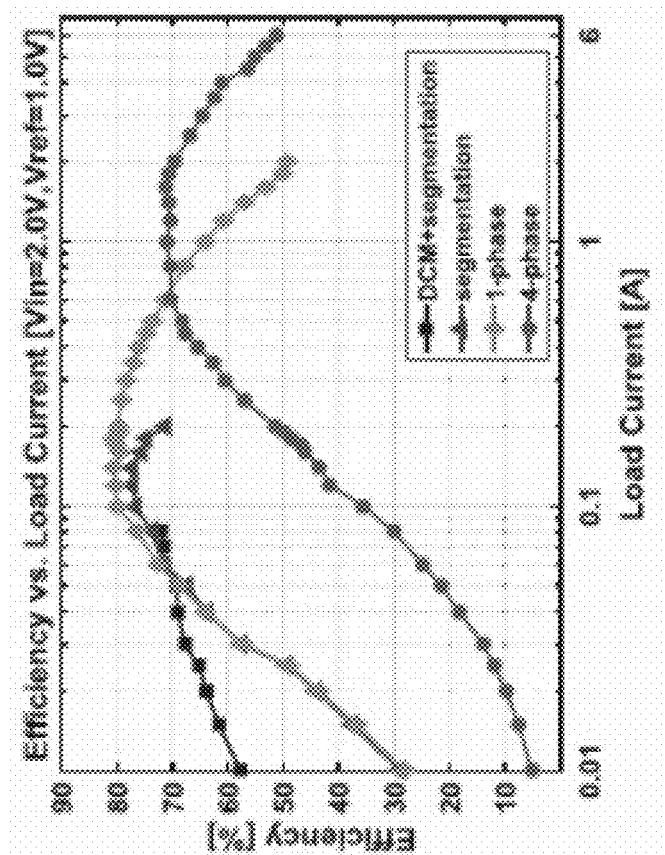
FIG. 12F plots DC-DC efficiency versus load current and mode (blue: segmentation and DCM, red: DCM; green: segmentation, according to one or more embodiments of the present invention.
Figure 12B:
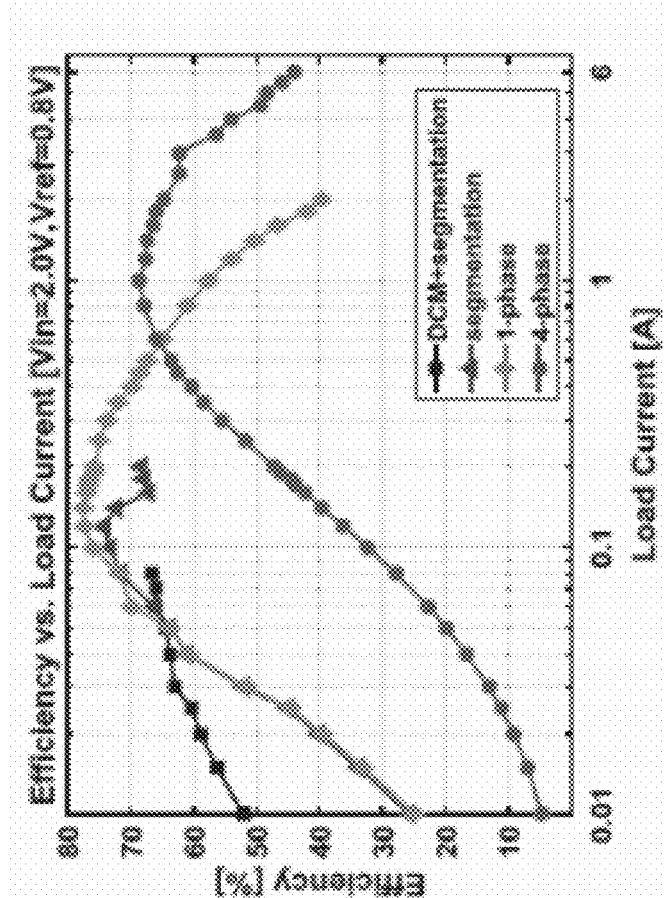
Figures 12D, 12E:
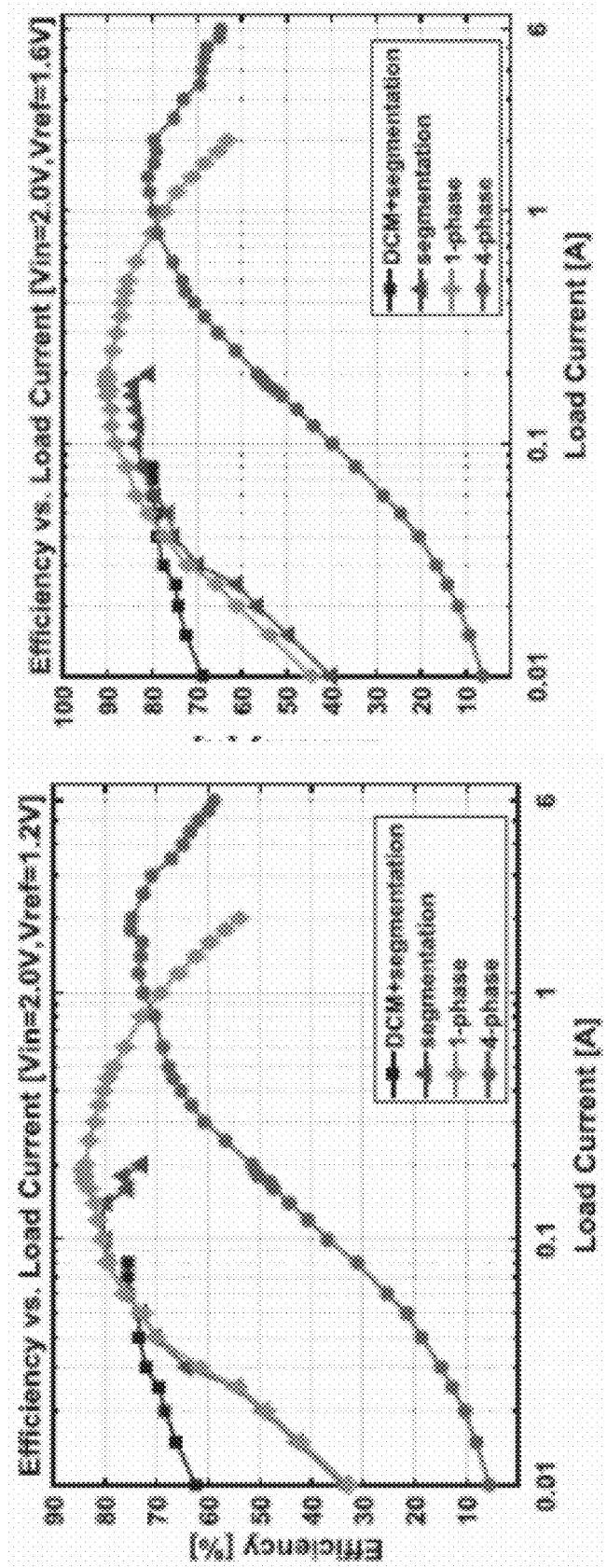
Figure 12F:
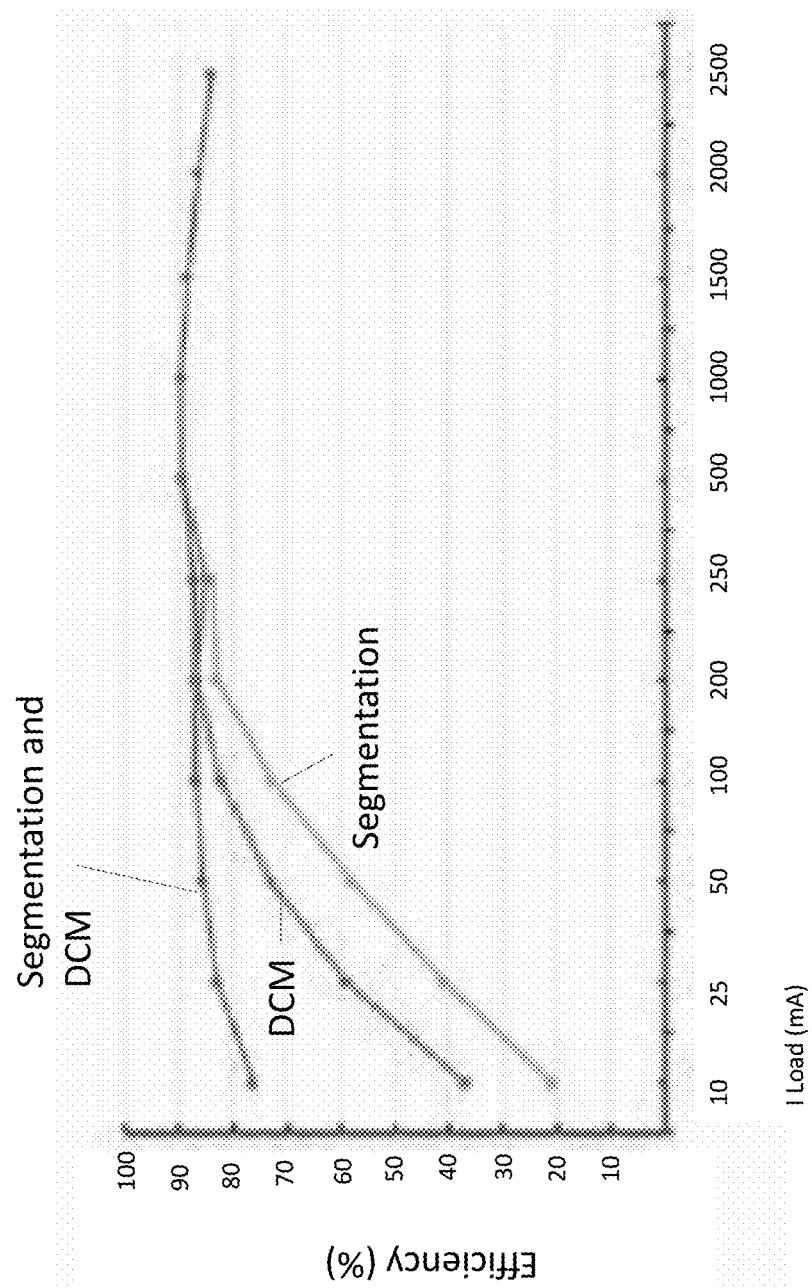

FIGS. 12(a)-12(b) plot measured power efficiency versus load current for different operation modes under different operation voltages, showing the digital control scheme of FIG. 1A operates across three modes depending on output current. With $f_{sw}$=5 MHZ, the measured power efficiency shows 90.5% peak efficiency at $V_i$=2V and $V_o$=1.6V and increased efficiency in light load regime due to implementation of the segmentation and the burst mode. Thus, "wallplug" efficiencies exceeding 90% have been demonstrated even using a sub-optimal package. The light-load efficiency of this design stands apart from the current generation of POLs.

It should be noted that this characterization data includes excess losses from the very non-ideal quad flatpack internal traces and bond wires, depressing the higher-load efficiency measurements.

f. Phase Shedding

At high current all four output phases are active. FIG. 12A shows light load efficiency is greatly enhanced by a DCM (hysteretic) mode and by the capability to shed phases. In FIG. 12A, an inflection can be seen at about 10% load (~1 A) where the 4-phase operation is beginning to be defined more by switching than conduction losses. At this point 3, of the 4 phases are shed, cutting switching losses by 75% and reaching overall peak efficiency at the lighter loads. This makes the converter a much better choice for smaller FPGAs (which may operate in the 0.2-1 A) range than commercially available rad hard POLs, which are well off peak efficiency at this point. The combination of some conventional converters' poor low-current efficiency and poor high-step-down-ratio efficiency produces a rather unattractive compound effect which segmentation according to embodiments of the present invention addresses elegantly.

At even lighter loads, a further fallback to "burst mode" (aka "DCM", discontinuous conduction mode) implemented using circuit embodiments described herein extends the range of decent efficiency down to 1% of full-load current. This feature is ideal for systems which operate in a sparse activity cycle where much of the overall power budget is spent in idle state, but must support relatively high currents for brief periods (as is the case for many space missions and instruments). A power system must be designed for the maximum demand, but this architecture minimizes the actual energy cost for that.

g. Operating Ranges (i) Minimum Operating Voltage

Thanks to the low power circuit design techniques, the voltage head room requirement for the internal hysteresis comparator in FIG. 1A can be greatly reduced. Thus, in one or more embodiments, the converter is capable of operating down to lower $V_{IN}$ supplies, unlike available commercial options. While most RH POLs capable of 5V operation cannot work much below 4V, the design of FIGS. 1A-1B and FIG. 3A has demonstrated capability (with good efficiency as well) down to 2V. For example, by decreasing the UVLO voltage, the power supply for the POL converters according to one or more embodiments can be as low as 2V which is suitable for 3.3V (a resource in some recent systems) or 2.5V applications (a common I/O voltage that is expected to persist for some time, as it supports various standard serial interfaces such as LVDS and those based upon that physical layer (SpaceWire).

A system which might need to tolerate a high variation in primary power supply voltage (such as, for example, a single-cell Li-ion powered CubeSat which varies widely between charging and deep discharge, falling below some commercial RV POLs' UVLO limit) would benefit from this attribute.

(ii) Maximum Voltage, Current, Safe Operating Area (SOA)

$V_{IN}$ can be increased by using a flip chip package that reduces the bonding wire inductance and high current ringing.

(h) Radiation Tolerance (i) Single Event Effects (SEE)

Heavy ion testing was performed at Texas A&M University (TAMU) Cyclotron using a range of ions (Table 1) (LET is Linear Energy Transfer).

| Ion | Energy (MeV) | Range (μm) | LET (MeV · cm$^2$/mg) |
|---|---|---|---|
| Ta | 2236 | 127.6 | 76 |
| Ag | 1376 | 128.2 | 41.2 |
| Kr | 1032 | 134 | 27.8 |

(ii) No Destructive Effects (SEL, SEB) were Observed

Figure 13:
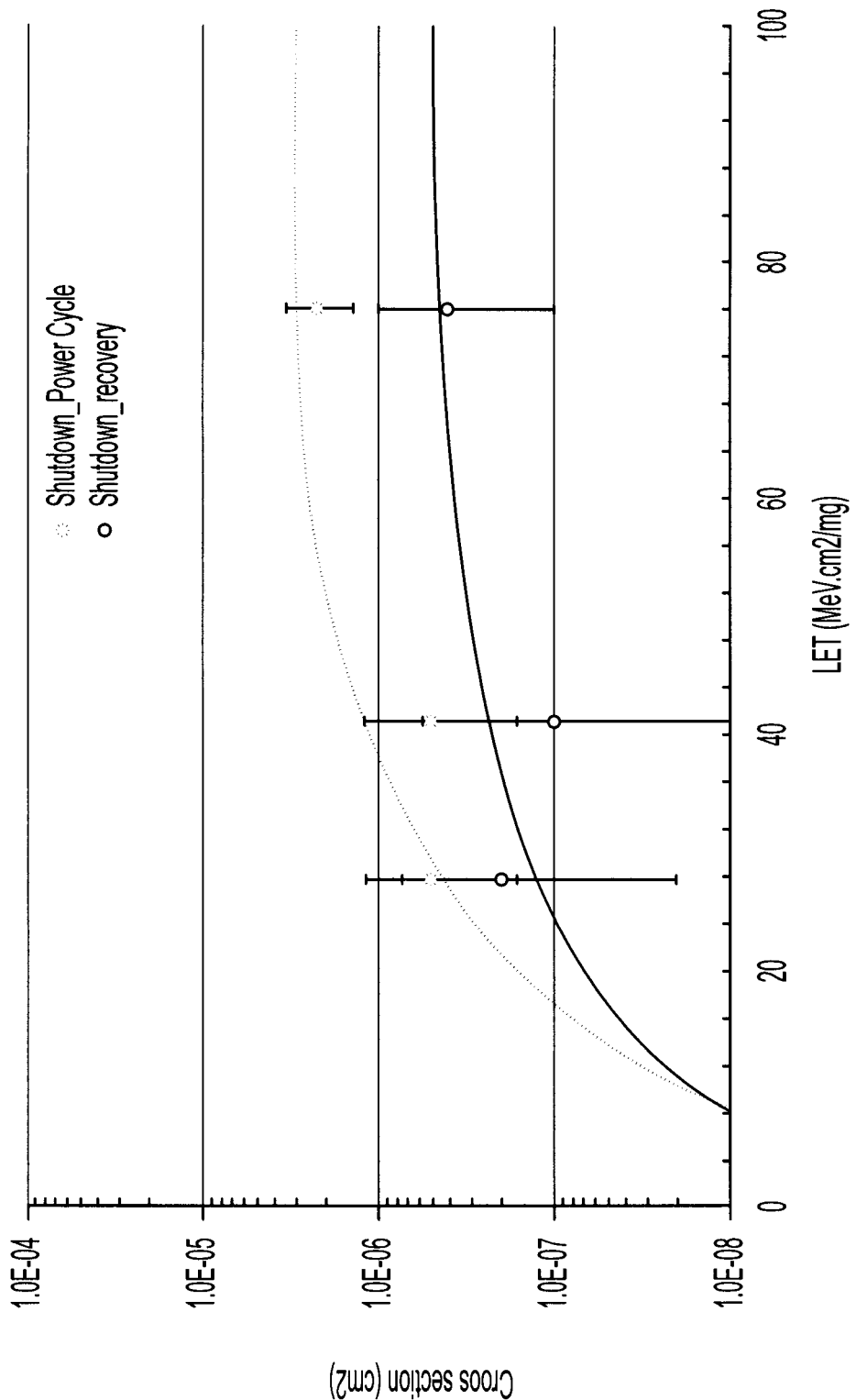
FIG. 13 plots SEFI cross-section versus LET, according to one or more embodiments of the present invention.

A functional interrupt cross-section with two distinct modes was observed (see FIG. 13), which involves the internal PGood (Power Good) sense function and associated registers; one mode is self-recovering and one requires power cycle. This stems from no attempts to SEE-harden this circuitry in this design. However, the circuitry can be SEE hardened.

Preliminary statistical analysis indicates that the rate of such a Single-event functional interrupts (SEFI) is about one in a hundred years. This can be eliminated using hardened registers known in the art or by hardwiring PGOOD and register to desired values.

The test report indicates that no output transients (SET) were observed (aside from the SEFI, which cannot be said to be "transient" per se). The criterion was +/−20 mV output deflection and no trigger events were observed. Thus, the design of FIGS. 1 and 3 is SET-free within quality-of-regulation tolerance band. Notably this result is achieved with an extremely low (10 uF) output filter. Certain other industrial RH POLs achieve a similar result but require 30-100× the bulk filter capacitance to do so.

(iii) Total Ionizing Dose (TID)

Figure 14:
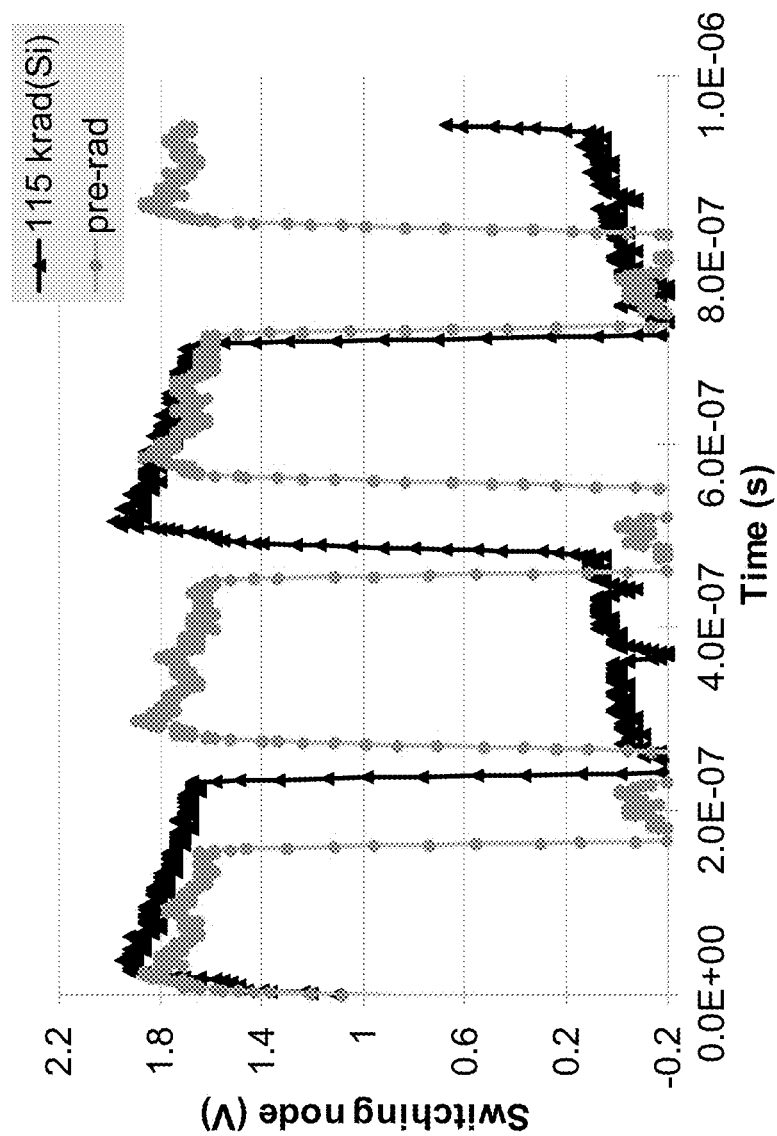
FIG. 14 illustrates normal operation up to 115 KRad, according to one or more embodiments of the present invention.

Single phase and multiphase converters were evaluated against total ionizing dose (TID) using a Co60 high dose rate irradiation source at the NASA, Jet Propulsion Laboratory. Irradiations were performed while operating the converter at low load (200 mA) to avoid any annealing behavior. The dose rate selected was 10 Rad(Si)/s. A total of four converters where evaluated. All the results indicated that the converter can survive a minimum of 100 kRad(Si). The converter never exhibited a total functional failure, however the first parametric failure that was observed was the switching frequency. After about 115 krad(Si), the DLL synchronizing of the four phase as well as the PLL within the single phase started losing lock, inducing a sudden drop into the switching frequency that was load dependent. Design mitigation, such as increasing dynamic range of PLL/DLL, will improve the locking/unlocking behavior and indirectly improve total dose tolerance. Using this design, a much higher total dose level can be achieved (an improvement of several tens of krad(Si)). FIG. 14 illustrates the sudden change in switching frequency of the chip under 115 kRad (Si).

(i) Comparison with Conventional Buck Converters

TABLE 2 comparisons with conventional multi-phase buck converters

| | JSSC '09 [1] | ISSCC '13 [2] | ISSCC '14 [3] | This Work |
|---|---|---|---|---|
| Control | Hysteretic | Voltage Mode | Hysteretic | Hysteretic |
| $V_{in(MAX)}$ (V) | 4.9 | 1.2 | 3.3 | 3.3 |
| $V_{OUT}$ (V) | 0.86-3.93 | 0.6-1.05 | 0.7-2.5 | 0.8-1.6 |
| $I_{MAX}$ (A) | 1 | 1.2 | 6 | 6 |
| $f_{sw}$ (MHz) (phases) | 32-35 (×4) | 100 (×4) | 40 (×4) | 3-9.5 (×4) |

TABLE 2-continued comparisons with conventional multi-phase buck converters

| | JSSC '09 [1] | ISSCC '13 [2] | ISSCC '14 [3] | This Work |
|---|---|---|---|---|
| Frequency Synchronization Error (%) | N.A. | N.A. | N.A. | ±1.5% |
| Voltage Regulation (%) | N.A. | N.A. | N.A. | ±1.06% |
| Current Sharing | None | Master-slave | Cycle-by-cycle | Master-slave (DCC-DL Control) |
| Current Mismatch | N.A. | N.A. | N.A. | ±1.5% |
| L(nH) | 110 | 8 | 78 | 330 |
| C(μF) | 0.00187 | 0.2 | 0.94 | 10 |
| Peak Efficiency(%) | 80 | 82.4 | 86.1 | 90.9 |

5. Chip Fabrication and Packaging

Figure 15:
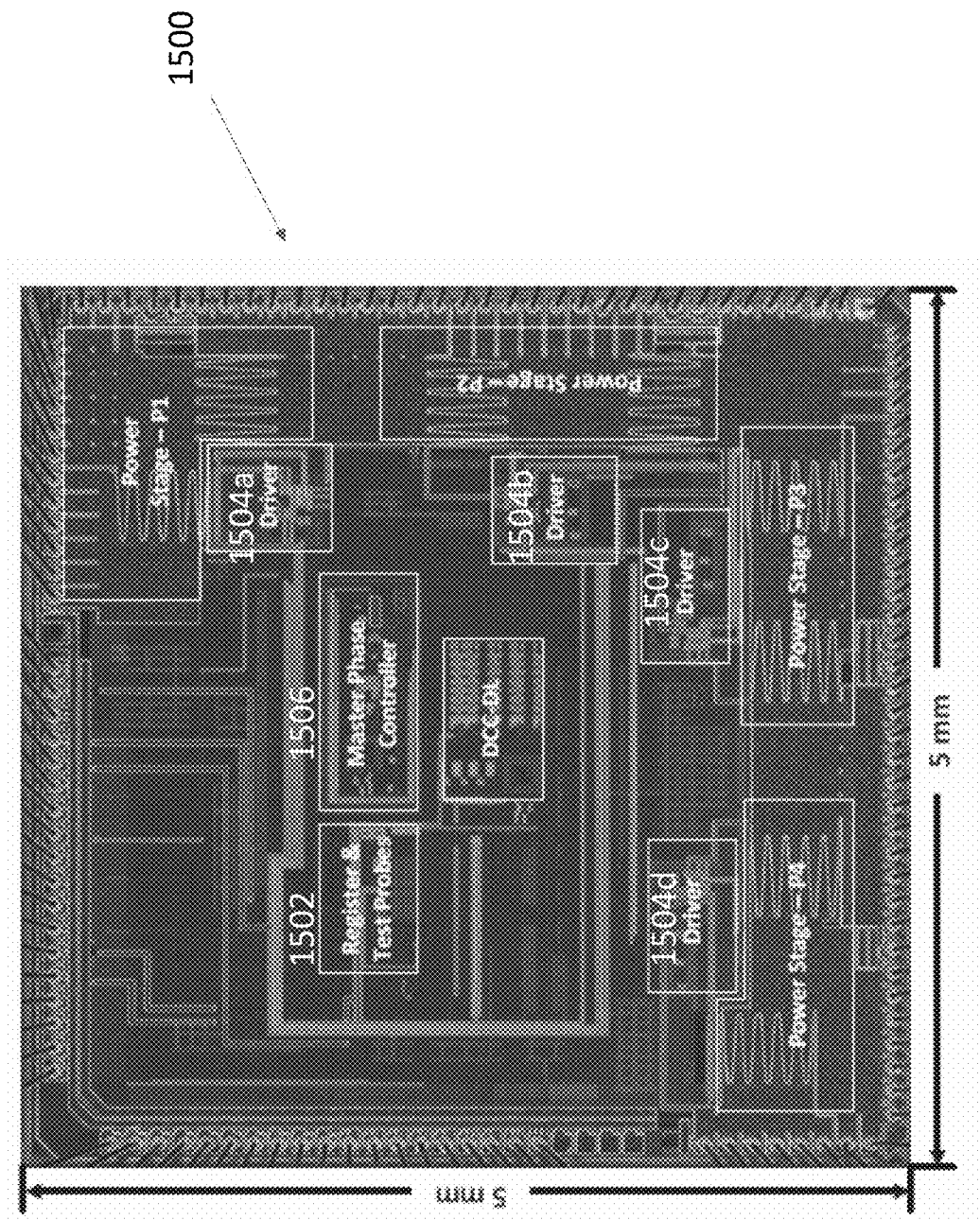
FIG. 15 is a die micrograph in 0.18 µm 5V CMOS according to one or more embodiments of the present invention.

The chip characterized and tested in section 4 was fabricated using an IBM CMOS 0.18 7 HV process. FIG. 15 is a die photograph from a packaged unit. The die size is 5 mm×5 mm. The 4 power switch phases (master phase P1 and slave phases P2, P3, P4) are located on the right and bottom sides of the die 1500. Also shown are register and test probes 1502, driver circuits 1504a, 1504b, 1504c, and 1504d for each of the master phase P1 and slave phases P2-P4, respectively, DCC-DL, and master phase controller 1704.

Figure 16A:
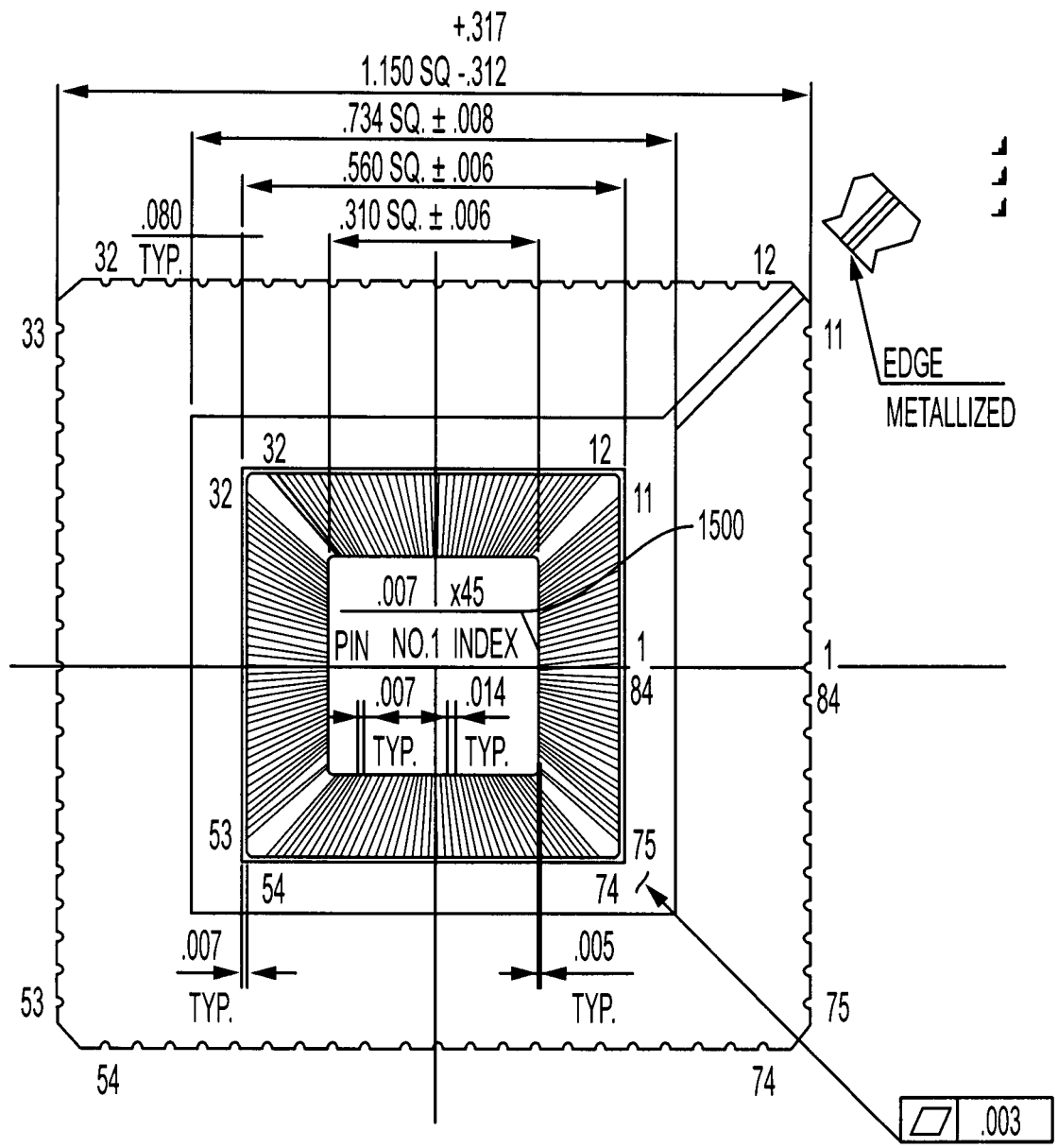
FIGS. 16A-16B are schematics of the package, according to one or more embodiments of the present invention.
Figure 16B:
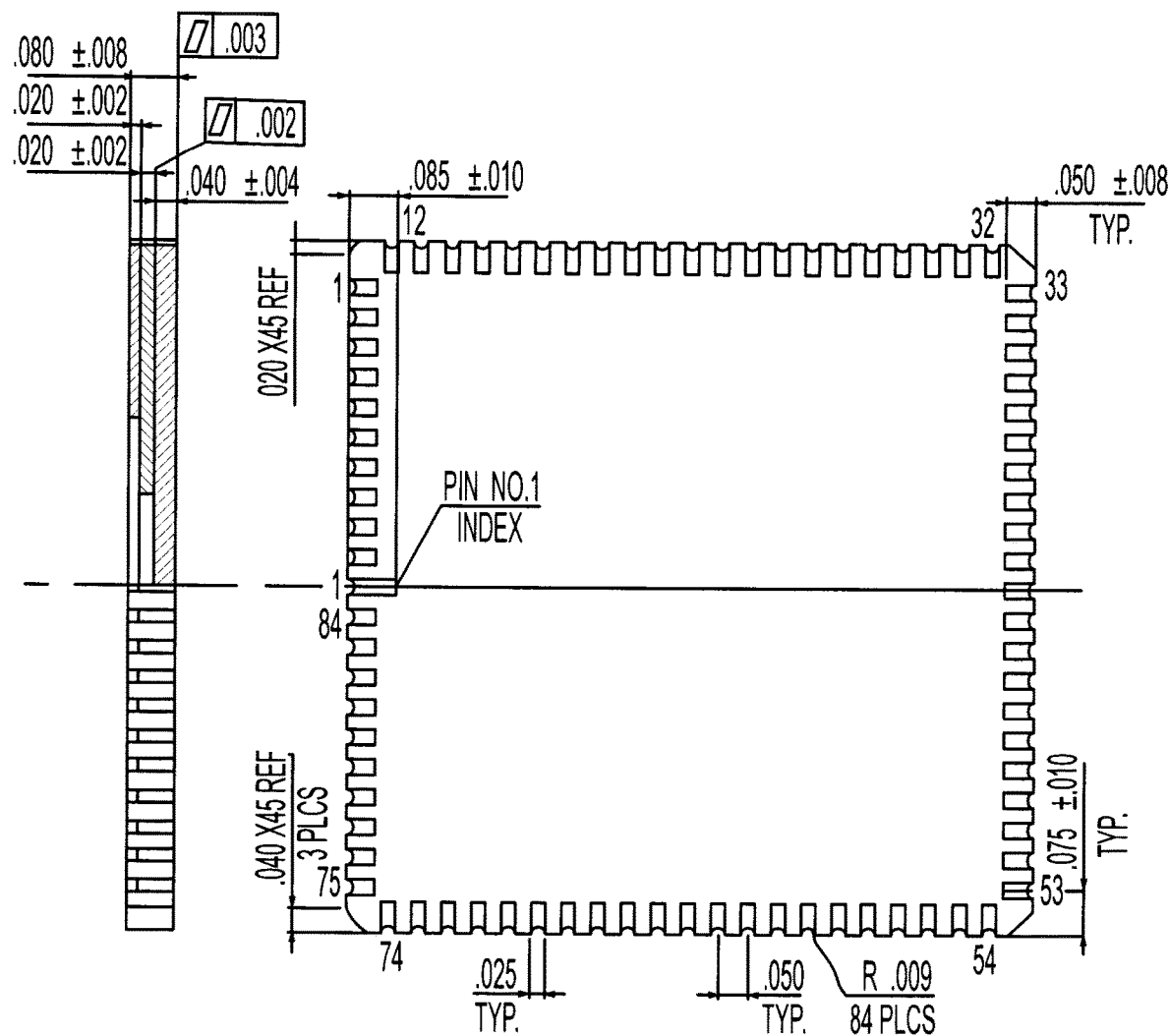
Figure 17:
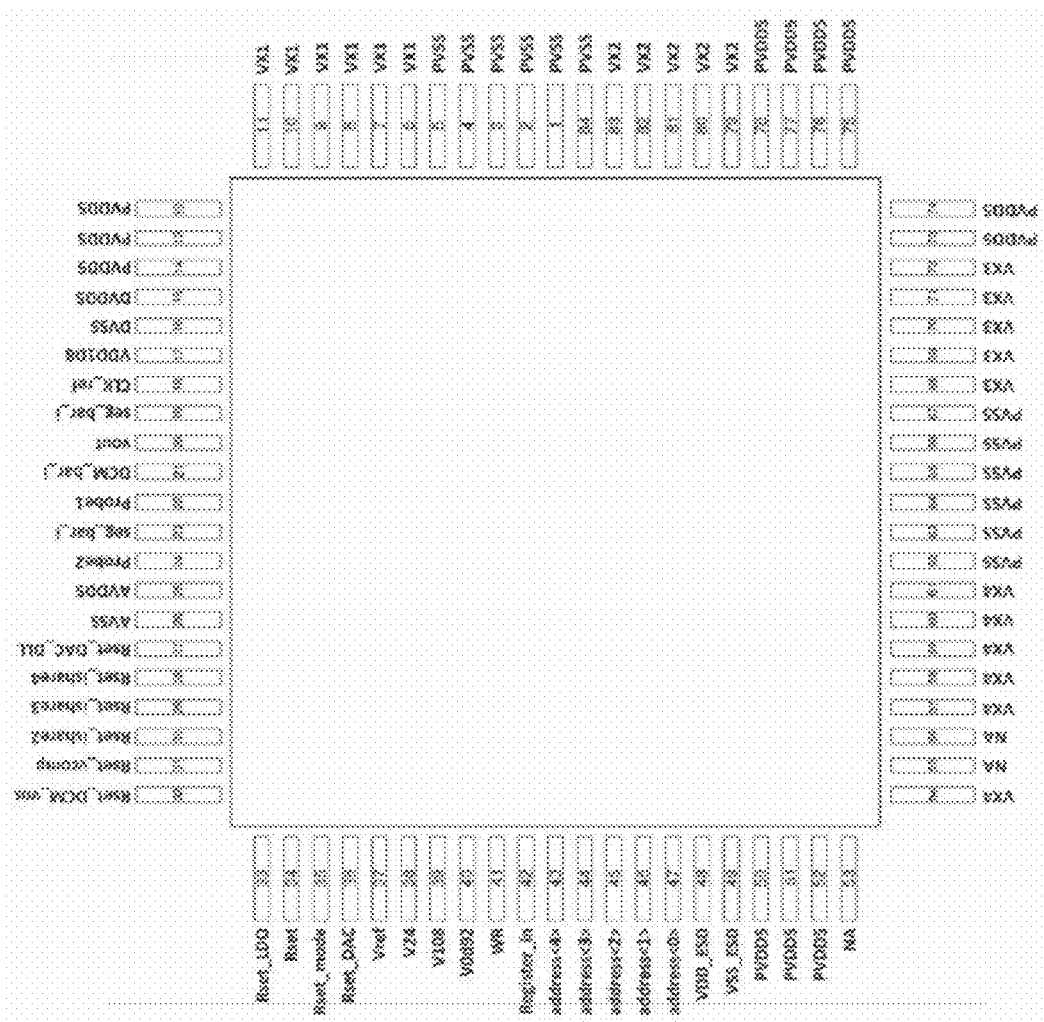
FIG. 17 illustrates a device pin out, according to one or more embodiments of the present invention.
Figure 18:
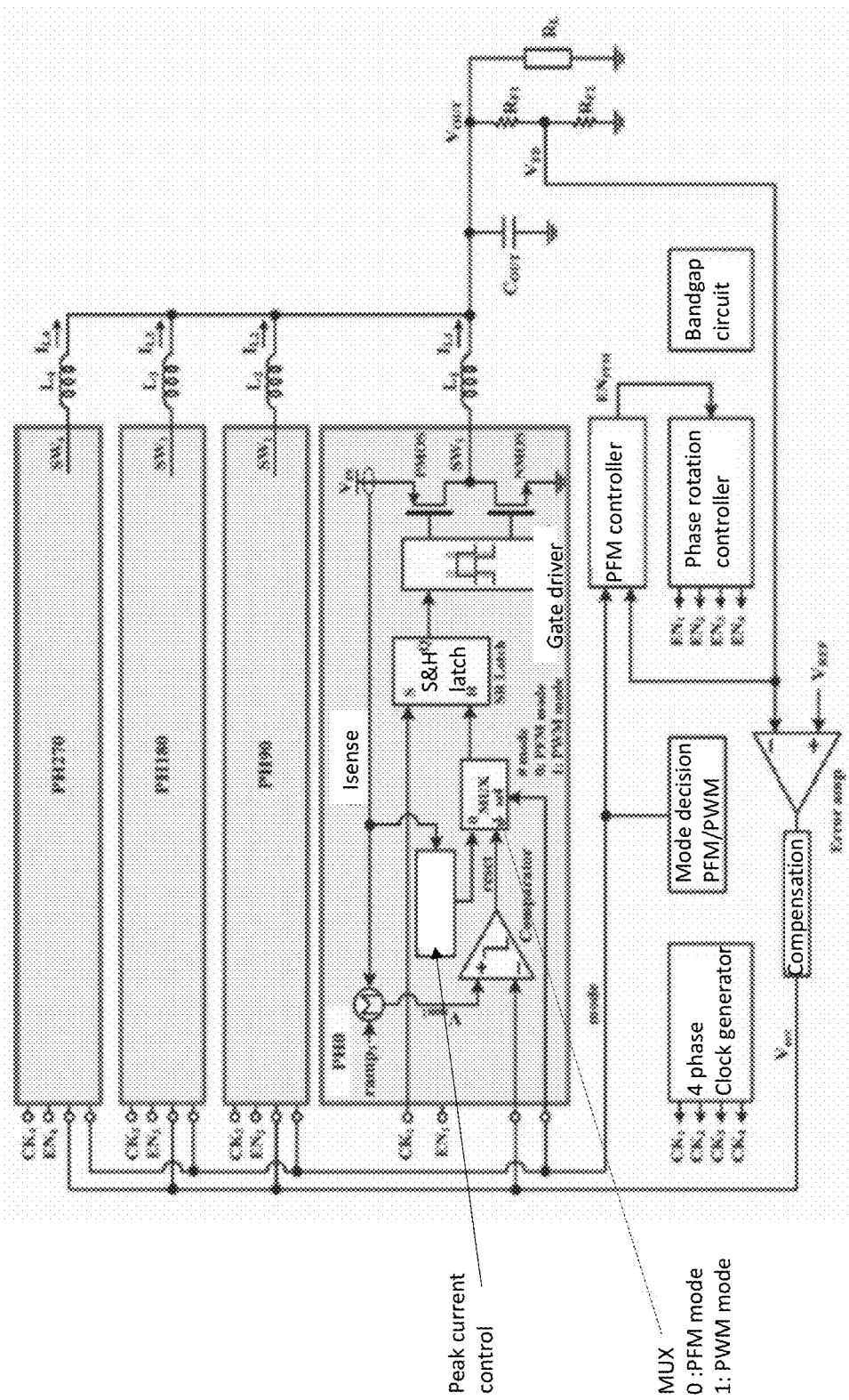
FIG. 18 illustrates a functional block diagram, according to one or more embodiments of the present invention.

FIGS. 16A-16B show the dimensions (in micrometers, wherein SQ. is square), FIG. 17 shows the pin layout, and FIG. 18 is a functional block diagram.

The present package is a traditional 84-lead quad flatpack/LCC. This package accommodates the large number of "access pins" desired for development but unneeded in applications, and adds a large parasitic resistance and inductance to power paths (supply, ground and output).

TABLE 3

Recommended Operating Ranges

| Symbol | Parameter/Conditions | Min | Typ | Max | Units |
|---|---|---|---|---|---|
| VDD | Supply input Voltage (PDVV5, DVDD5, AVDD5) | 4.5 | 5.0 | 5.5 | V |
| VIO | Input/Output Pin Voltage | −0.3 | | VDD + 0.3 | V |
| IOUT | Output Current, per lead | −500 | | 500 | mA |
| IOUT | Output Current, Total | −10 | | 10 | A |
| IIN | Input Pin Current | −10 | | 10 | mA |
| $T_c$ | Operating Temperature, Case (1) | −55 | | 125 | ° C. |

Case temperature derating based on continuous output current applies above 105° C. (TBD) for long term reliability.

| | Absolute Maximum Ratings | | | |
|---|---|---|---|---|
| Symbol | Parameter/Conditions | Min | Max | Units |
| VDD | Supply Input Voltage (PDVV5, DVDD5, AVDD5) | −1.0 | 6.0 | V |
| VIO | Input/Output Pin Voltage | −1.0 | VDD + 1.0 | V |
| IOUT | Output Current, per lead | −1000 | 1000 | mA |
| IIN | Input Pin Current | −50 | 50 | mA |
| $T_c$ | Soldering Temperature, Case 10 s maximum | | 300 | ° C. |

Maximum Output Current Specified at Maximum Voltage

TABLE 5

Target Electrical Specifications: Temp = −55 to +125° C., $V_{IN}$ = 4.5-5.5V
unless otherwise noted
Electrical Specifications

| PARAMETER | SYMBOL | TEST CONDITIONS | MIN | TYP | MAX | UNITS |
|---|---|---|---|---|---|---|
| DVDD AND PVDD | | | | | | |
| VDD Supply Current | IDDQ | EN = 0V, DVDD = PVDD = 5V (common) | | 10 | | mÅ |
| VDD Supply Current | IDD0 | EN = 0V, DVDD = PVDD = 5V (common) | | 10 | | mÅ |
| LOGIC INPUT VOLTAGE | | | | | | |
| Input High Voltage Minimum | VIH | | | | 70 | %VDD |
| Input Low Voltage Maximum | VIL | | 30 | | | %VDD |
| LOGIC INPUT CURRENT | | | | | | |
| Input High Current | IH | VIH = DVDD | 0 | | 0.1 | µÅ |
| Input Low Current | IL | VIL = VSS | 0 | | 0.1 | µÅ |
| VDD UVLO THRESHOLD | | | | | | |
| VDD, PVDD Rising UVLO Threshold Voltage | VUVR | | 1.9 | 2 | 2.1 | V |
| VDD, PVDD Rating UVLO Threshold Voltage | VUVF | | | | | V |
| SOFT-START | | | | | | |
| Soft Start Slew Rate | SSSR | | | | | mV/µs |
| Soft Start Delay from Enable High | SSD | | | | 0.1 | µs |
| POWER-GOOD | | | | | | |
| PGOOD Put-Down Impedence | RPG | | | | 50 | Ω |
| PGOOD Leakage Current | IPG | | | | 1 | µÅ |
| CURRENT SENSE | | | | | | |
| Average OCP Trip Level | IOCP | | | | | mÅ |
| Short-Circuit Protection Threshold | IOSC | | | | | mÅ |
| Sensed Current Tolerance | ISCT | | −10 | | 10 | % |
| HIGH AND LOW SIDE SWITCHES | | | | | | |
| HSS On Resistance | RHSS | | | 60 | 100 | mΩ |
| LSS On Resistance | RLSS | | | 50 | 65 | mΩ |
| HSS OFF Leakage | IHSS | | | | 10 | µÅ |
| LSS Off Leakage | ILSS | | | | 10 | µÅ |
| ACCURACY | | | | | | |
| Internal VREF Accuracy | VREFA | Nominal 1.00 V Internal reference, $Z_2$ >1M | −2 | 0 | 2 | % |
| Regulation Loop Accuracy | REGA | External VREF = 1.000 V | −1 | 0 | 1 | % |
| SWITCHING FREQUENCY | | | | | | |
| Free Running Frequency | FSWF | | 4.5 | 5 | 5.5 | MHz |
| Locked Running Frequency | FSWL | FREF = 5 MHz | 4.95 | 5 | 5.05 | MHz |
| Switch Cross-conduction Dead Time | TDT | | 2.9 | 5 | 8.7 | nS |
| DYNAMIC ACCURACY | | | | | | |
| Load Overshoot | LOS | 8A/100 nS load step | | | 10 | % |
| Load Undershoot | LUS | −8A/100 nS load step | −10 | | | % |
| Setting Time to !% | TSS | +/−8A/100 nS load step | | | | µs |
| CURRENT SHARING ACURACY | | | | | 10 | |
| Slave Phase Current Matching To Master | ISM2,3,4 | lmaster = 2A | −1 | | 1 | % |
| CONVERSION EFFICIENCY | | | | | | |
| EFFICIENCY | EFF1 | VIN = 5.0 VOUT = 1.0 ILOAD = 10A | | 90 | | % |

55
Net efficiency inclusive of external passives, depends significantly on component selection.

TABLE 6

Device Pin Descriptions

| PIN NUMBER | NAME | DESCRIPTION |
|---|---|---|
| 1, 2, 3, 4, 5, 84 | PVSS | This pin is the power ground for the master phase (shorted to other PVSS, AVSS and DVSS on PCB). |

TABLE 6-continued

Device Pin Descriptions

| PIN NUMBER | NAME | DESCRIPTION |
|---|---|---|
| 6, 7, 8, 9, 10, 11 | VX1 | This pin is the output of the internal power blocks and should be connected to the Ph1 (0°) output filter inductor. |
| 12, 13, 14 | PVDD5 | This pin is the 5 V power supply of the master phase (shorted to other PVDD5, DVDD5 and AVDD5 on PCB). |
| 15 | DVDD5 | This pin is the 5 V supply for the digital blocks on chip (shorted to PVDD5 and AVDD5 on PCB). |
| 16 | DVSS | This pin is the ground for all digital blocks on chip (shorted to PVSS and AVSS on PCB). |
| 17 | VDD1D8 | This pin is the backup power supply for internal 1.8 V digital blocks on chip. |
| 18 | CLK_ref | This pin is the 5 MHz clock reference input. |
| 19 | seg_bar_l | This pin is the backup for segmentation mode control input. |
| 20 | vout | This pin is the buck converter output used for voltage regulation. |
| 21 | DCM_bar_l | This pin is the backup for DCM mode control input. |
| 22 | Probe1 | This pin is for test purpose. |
| 23 | Shed_bar_l | This pin is the backup for phase shedding mode control input. |
| 22 | Probe2 | This pin is for test purpose. |
| 25 | AVDD5 | This pin is the 5 V supply for the analog blocks on chip (shorted to PVDD5 and DVDD5 on PCB). |
| 26 | AVSS | This pin is the ground for all analog blocks on chip (shorted to PVSS and DVSS on PCB). |
| 27 | Rset_DAC_DLL | This pin is for setting the biasing current for internal DAC, Nominal value is 150 KΩ. |
| 28 | Rset_ishare4 | This pin is the backup for tuning the offset of power train current sensor. Nominal value is 12 KΩ. |
| 29 | Rset_ishare3 | This pin is the backup for tuning the offset of power train current sensor. Nominal value is 12 KΩ. |
| 30 | Rset_ishare2 | This pin is the backup for tuning the offset of power train current sensor. Nominal value is 12 KΩ. |
| 31 | Rset_vcomp | This pin is for setting the biasing current for internal voltage compensation block. Nominal value is 200 KΩ. |
| 32 | Rset_DCM_vos | This pin is for setting the current threshold for DCM mode. Nominal value is 120 KΩ. |
| 33 | Rset_LDO | This pin is for setting the biasing current for LDO block. Nominal value is 10 KΩ. |
| 34 | Rset | This pin is for setting the biasing current for analog blocks. Nominal value is 120 KΩ. |
| 35 | Rset_mode | This pin is for setting the current threshold for different working mode. Nominal value is 120 KΩ. |
| 36 | Rset_DAC | This pin is for setting the biasing current for internal DAC. Nominal value is 150 KΩ. |
| 37 | Vref | This pin is the regulation reference voltage input; may be left open if using internal Vref |
| 38 | V24 | This pin is an reference voltage inout for internal ckty; set to VDDx/2; may be left open if VDDx = 5 V |
| 39 | V108 | 1.08*Vref reference voltage input for internal ckty; may be left open if using internal Vref |
| 40 | V0d92 | 0.92*Vref reference voltage input, for internal ckty; may left open |
| 41 | WR | This pin is the write enable for the internal register. |
| 42 | Register_in | This pin is the register data input. |
| 43 | address<4> | This pin is the register address input. |
| 44 | address<3> | This pin is the register address input. |
| 45 | address<2> | This pin is the register address input. |
| 46 | address<1> | This pin is the register address input. |
| 47 | address<0> | This pin is the register address input. |
| 48 | VDD_ESD | This pin is the 5 V power supply for ESD ring (connect to PVDD5, DVDD5 and AVDD5 on PCB). |
| 49 | VSS_ESD | This pin is the ground for ESD ring (connect to PVSS, AVSS and DVSS on PCB). |
| 50, 51, 52 | PVDD5 | This pin is the 5 V power supply of the slave phase (connect to other PVDD5, DVDD5 and AVDD5 on PCB). |
| 53, 55, 56 | NA | NA |
| 54, 57, 58, 59, 60, 61 | VX4 | This pin is the output of the interal power blocks and should be connected to the Ph4 (270°)output filter inductor. |
| 62, 63, 64, 65, 66, 67 | PV55 | This pin is the power ground for the slave phase (connect to other PVSS, AVSS and DVSS on PCB). |
| 66, 69, 70, 71, 72 | VX3 | This pin is the output of the internal power blocks and should be connected to the Ph3 (180°)output filter inductor. |
| 73, 74, 75, 76, 77, 78 | PVDD5 | This pin is the 5 V power supply of the slave phase (connect to other PVDD5, DVDD5 and AVDD5 on PCB). |

TABLE 6-continued

Device Pin Descriptions

| PIN NUMBER | NAME | DESCRIPTION |
|---|---|---|
| 79, 80, 81, 82, 83 | VX2 | This pin is the output of the internal power blocks and should be connected to the Ph2 (90°)output filter inductor. |

Multiple pins are provided to enable tailoring of internal operating bias. The "Rset_*" pins may be provided a resistor to in order to adjust the operating characteristics.

6. Configurability

Many aspects of chip operation are accessible vie a SPI (serial peripheral interface) bus port on the current design. This interface does not require to be exercised in order for the part to initialize or operate, but is available for more sophisticated applications that require some intelligence or adaptability.

The key parameters which is accessible via the SPI bus are listed below.

| Parameter | Descriptions |
|---|---|
| DTC[1:0] | 2 bits dead time control. Dead time control is designed for the power FETs driver in order to avoid the current shoot through. Default value is 00. |
| Z_PPL[2:0] | 3 bits digital PLL feed-forward gain. A PI compensator is degined to stabilize the digital frequency synchronization loop. These three bits are used to tune the zero locations to provide sufficient phase margin. Default value is 010. |
| Z_DLL[2:0] | 3 bits digital DLL feed-forward gain. A PI compensator is degined to stabilize the digital delay locked loop for phase synchronization. These three bits are used to tune the zero locations to provide sufficient phase margin. Default value is 010. |
| BGR_trim[4:0] | 5 bits internal bandgap trimming bits. An internal bandgap and LDO are designed to provide the accurate voltage reference on chip. The default value is 01111. |
| EN_Buck | Buck enable control bit. Once set to 0, the whole chip is shutdown including the bandgap and LDO. Default value is 1. |
| PWG | Power good control bit. Once set to 0, the buck converter is shutdown except the bandgap and LDO. Default value is 1. |
| Dis_PD_LF | Internal PLL loop enable control bit. To save power, the digital frequency synchronization loop can be disabled and enable the buck converter works under a low switching frequency to boost the efficiency performance. Default value is 0. |
| Dis_PD_LF_DLL | Internal DLL loop enable control bit. Once set to 0, the interal DLL is disabled to save power. Default value is 0. |
| Shed_bar | Active-low phase shedding enable. Once set to 0, the buck converter is forced to work in the multi-phase mode. |
| Seg_bar | Active-low segmentation enable. Once set to 0, the buck converter is forced to work in the segmentation mode. |
| DCM_bar | Active-low burst mode enable. Once set to 0, the buck converter is forced to work in the burst mode. |

7. Possible Modifications and Variations a. Elimination of Debug Ports

One reason for the high pin count of the development-phase package in section 5 is the presence of numerous debug and bias ports on the part. Non-development package pin count and size can be significantly reduced. However, in some embodiments, multiple power/output/ground pins per phase provide high current and low series resistance.

The pins for one product embodiment are listed below.

| Pins | Descriptions |
|---|---|
| VIN(1-4) | Input power supply. Typical value is 5 V. |
| SW (1-4) | Switching node which drives the external LC low-pass filter. |
| GND (1-4, plus AGND) | Ground. Connect to ground plane. |
| EN | Enable for buck converter. Force high to enable, force low to disable the IC. |
| Sync | Reference clock input. Driving this pin with the external clock sets the switching frequency of the buck converter. Pulling this pin low sets the switching frequency to the internal default value. |
| AGND | Analog Ground. |
| AVIN | Analog VIN |
| PGOOD | "Power Good" Output |
| SSCap | External Soft Start capacitor (optional) |
| SDI | SPI bus data input |
| SDO | SPI bus data output |
| SCLK | SPI bus clock |
| VREF | exernal VREF overrides internal reference | b. Packaging Optimization

Figure 19:
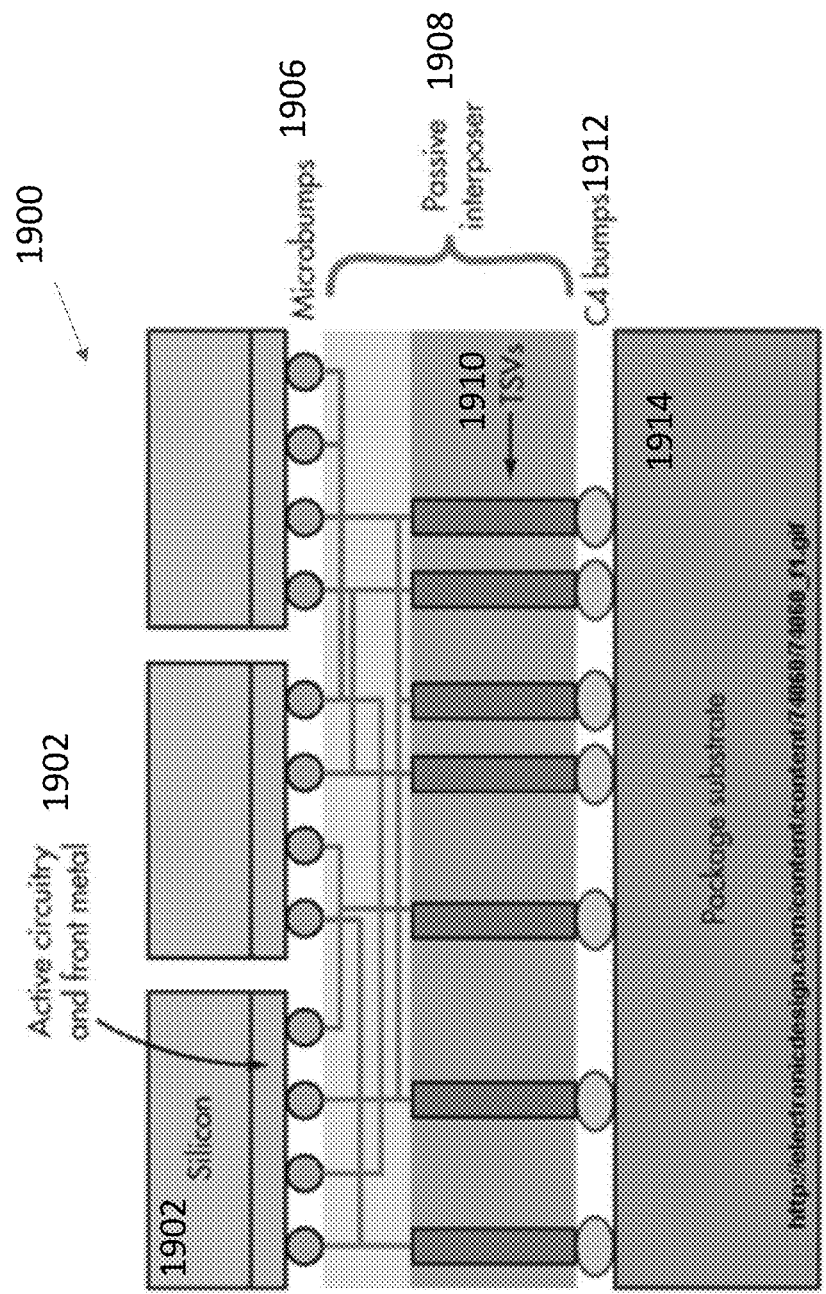
FIG. 19 illustrates a flip chip packaging and 2.5D integration that can be used to package the converter according to one or more embodiments of the present invention.
Figure 20:
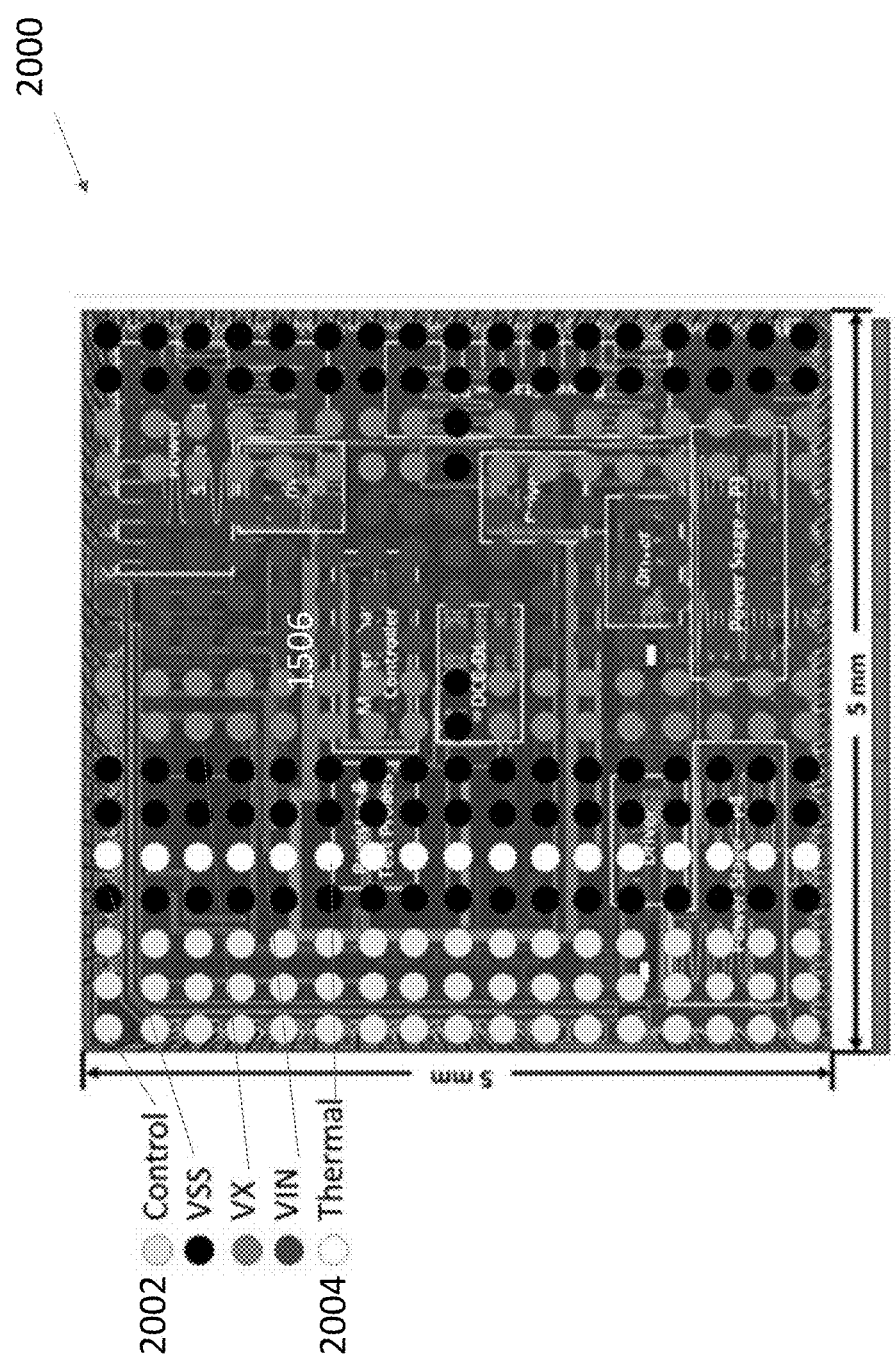
FIG. 20 illustrates flip chip die connections enabling 300 micron balls 500 micron pitch connections, 1.6 Amps per phase @ 150 degrees Celsius, and 2.5 Amps per phase at 125 degrees Celsius, according to one or more embodiments of the present invention.

The package (section 5) used in for the validation (section 3) is a package not optimized for high current, size or any other attribute. Packaging may be optimized as desired, e.g., for chip-scale/enhanced die for ultimate compactness and minimum added series resistance/inductance. FIG. 19 shows an example of a highly integrated "2.5D" assembly. The flip chip packaging 1900 comprises silicon 1902, active circuitry (which can be designed to comprise converter 100, 300) and front metal 1904, microbumps 1906, passive interposer 1908, through silicon vias 1910, and bumps 1912 connecting to the package substrate 1914. FIG. 20 illustrates flip chip package 2000 comprising bump connections 1906 for control 2002, VSS, VX, Vin, and thermal readings 2004 overlaid on the die 1500 of FIG. 15.

Moving to a flip-chip, bump/ball/column attach style yields benefits on multiple fronts. Die area can be reduced because pads no longer must be arranged at the periphery and power bussed along long traces to the power switches. Conduction losses also are improved by shorter, more efficient routing (less L, less R) raising the overall assembly's high current efficiency. More pads can be placed (paralleling high current feeds) when the entire die face is "in play" for parallel resistance reduction. The assembly style can be matched to client devices (FPGAs, advanced digital ASICs/SoCs) so as to harmonize assembly.

However, traditional hermetic, surface mount packaging with compliant leads can also be used. Standard hermetic ceramic packaging is suited to high reliability, wide temperature range applications. Such packages can also be made compatible with a flip-chip designed die.

Figure 21:
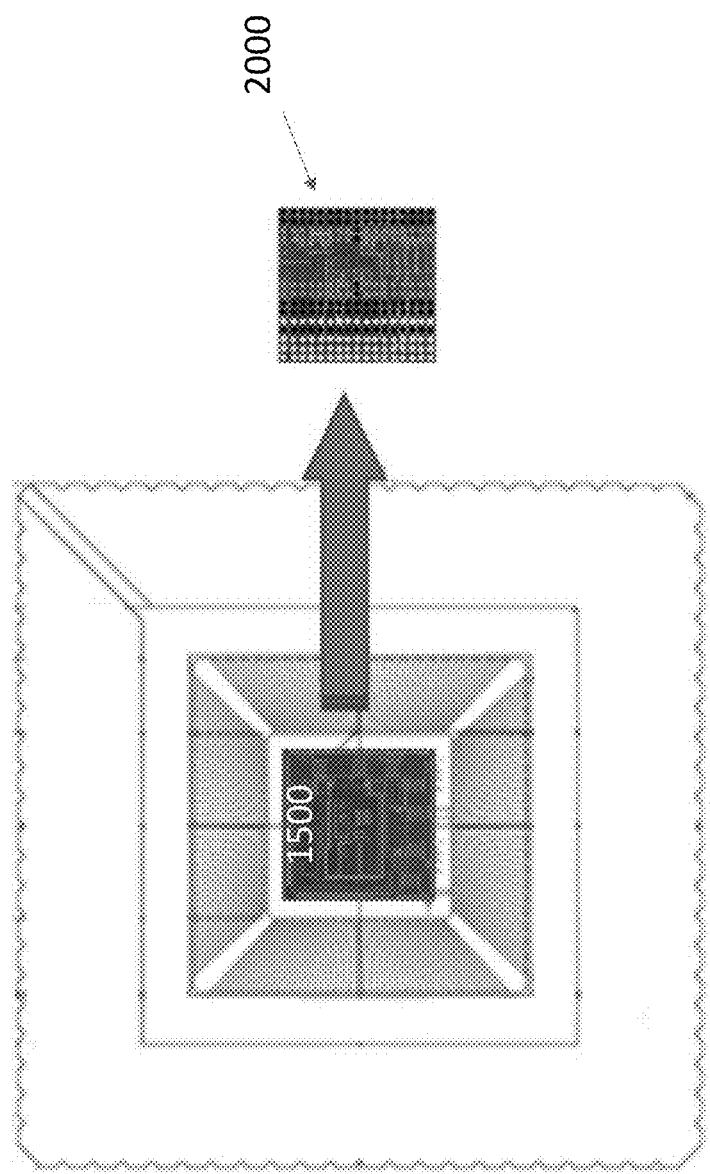
FIG. 21 illustrates Sixe reduction using packaging technology, according to one or more embodiments of the present invention.

For systems which can use chip-scale packaging, the improvements in size, mass and cost are remarkable. FIG. 21 shows the size reduction from the hermetic package of FIGS. 16A-16B to the ball-array chip-scale package shown in FIG. 19.

c. Additional Features

The chip incorporating the DC/DC converter can have many options and features in varying combinations. Some common ones are:

Power Good—a flag (usually active high) indicating that the output is within or close to regulation tolerance. This feature is often used by power supply sequencing controllers. This function is already present internally, requiring small modifications to eliminate single event sensitivity and provide off-chip drive capability.

Soft Start—a controlled turn-on voltage ramp rate, which ensures a tolerable input current that the upstream supply can manage to provide without overstress or entering current-limit. Modification to allow varying the ramp time (to suit the particular specs of a "client" part) can also be implemented.

Rad-hard precision reference—the design in section 4 incorporates a voltage reference and allows external precision reference voltage to be used instead. An enhanced voltage reference would eliminate an external, expensive piece-part from the larger assembly and suitable-voltage references for sub-bandgap voltages used in modern digital, in acceptable tolerance and radiation hardness grades, without their own single event transients to impact quality-of-regulation are roughly none. This enhancement can comprise addition of OTP trim capability (for make and tempco tolerances), which is available on the foundry flow.

Current Limiting—Most DC-DC converters provide some form of current limiting, generally pulse-by-pulse. Fewer also provide a "backstop" overcurrent protection in case some fault causes the basic current limit (usually a limit value on the control loop's demand signal) to fail to control the current. The simplest approach is to check the present design's limit values and adjust (if even required) for part reliability. This may range from a characterization task to a simple bit of clamp circuitry at a strategic point in the control loop.

UVLO (Undervoltage Lockout)—a feature which prevents startup until the input supply has reached the greater of (1) the voltage required for the POL to function or (2) the voltage that makes producing the desired output possible (a buck converter can only reduce voltage). The present design's UVLO is fixed and relatively low, as the design is quite capable of operating to below 2V. However, starting up at 1.8V would result in an improper output if the desired VOUT was 2.5V (a common I/O supply). A minor modification to make UVLO comprehend the output setpoint (2) can be implemented.

Ruggedness and Non-ideal board design—a packaging-induced limitation has been seen at 5V operation and heavy loads. Excessive wirebond and leadframe inductance, in conjunction with VX (switch node) capacitance (also package, and additionally PCB-design driven) can cause switch-node ringing to exceed the absolute maximum voltage rating of the switch FETs. Switch transistor layout modifications to maximize device ruggedness can be implemented to make board/module design less critical for the user. The impact to performance should be nil (but positive in the sense of component tolerance to mishap), impact to layout very small (involving close-in features such as guardring placement) and the overall effort quite modest, involving mostly initial failure analysis and transistor relay-out.

8. Applications

Figure 22:
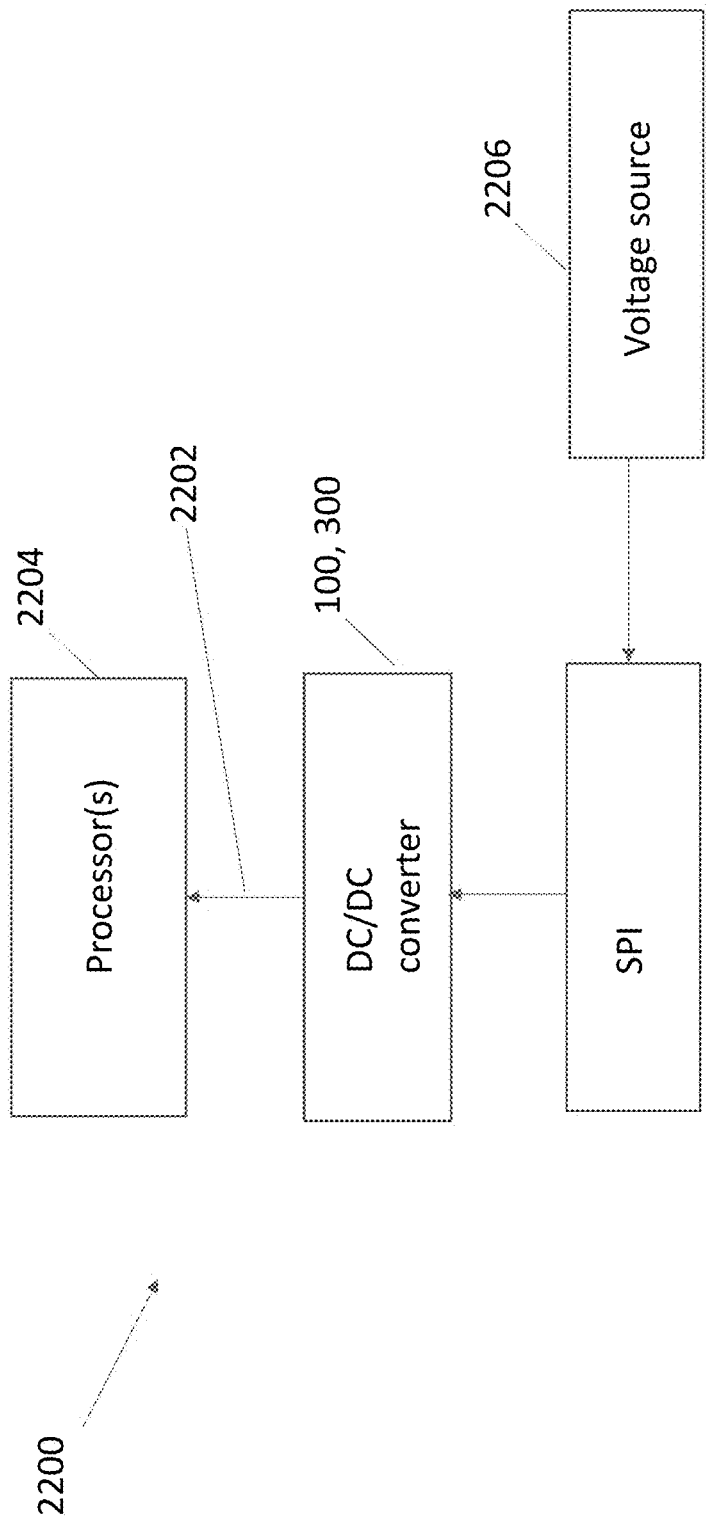
FIG. 22 illustrates hardware including the DC/DC converter according to one or more embodiments of the present invention.

FIG. 22 is a block diagram illustrating a data processing system 2200 comprising the DC/DC converter 100, 300, according to embodiments of the invention, connected 2202 to an application (e.g., computing system including processor(s) 2204) and converting (step up or step down) one or more DC voltages received from a voltage supply 2206 (e.g., power supply) to one or more voltages used by the processor(s) 2204. In one or more embodiments, the DC/DC converter is interfaced to the voltage supply 2206 using an interface such as a serial peripheral interface SPI (however, other bus architectures can be used). In one or more embodiments, an operating system runs on processor(s) 2204 and is used to coordinate and provide control of various components within data processing system 300. Those of ordinary skill in the art will appreciate that the hardware in FIG. 22 may vary depending on the implementation. Other internal hardware or peripheral devices, such as memory (e.g., flash ROM (or equivalent nonvolatile memory) and the like, may be used in addition to or in place of the hardware depicted in FIG. 22. Also, the processes of the present invention may be applied to a multiprocessor data processing system. In one or more embodiments, the SPI programs at least one parameter of the converter 100, 300, the at least one parameter selected from feed forward gain of the digital PLL, dead time of the driver for the converter, and mode select between CCM and DCM.

DC/DC converters according to embodiments of the present invention can be used to power the processor(s) 2204 comprising FPGAs, Digital Signal Processors, Central Processing Units, Graphics Processing Units, and ASICs, e.g., in a wide variety of terrestrial and space environments, e.g., as found in computers and communications devices (e.g., satellites, such as Cubesats, and mobile devices such as cell phones and smart phones).

9. Advantages and Improvements

Advanced digital semiconductor products such as FPGAs, Digital Signal Processors, Central Processing Units, Graphics Processing Units, and ASICs are produced on foundry technology "nodes" which operate at very low core voltages but conversely high currents. For example, a FPGA may have a core voltage of 1.00V and draw 10 A of current with tight transient requirements. This sort of power requirement is outside the reach of the pulse width modulation (PWM) regulator ICs. Moreover, modern digital platforms place tighter constraints on total supply deflection (load step, line sag) and noise (ripple) than previous generations. Particularly in the high speed serial resources, such deviations can ruin signal integrity by the conversion of voltage error to time error (eye violation, clock recovery phase slewing).

Furthermore, only recently have any suitable POL regulators appeared in radiation tolerant form. One or two are free of radiation sensitivities, others have issues such as heavy-ion single event functional interrupt (SEFI)[7], single event gate rupture (SEGR)[8] or single event burnout (SEB)[9]. All of the commercial radiation hard POLs are quite expensive. Moreover, their performance, especially against high step-load transients, is limited without large amounts of output filter capacitance, which is another costly element. The step load performance of these POLs is limited by their use of classical linear feedback loops, which impose a bandwidth limitation. The efficiency of these products does not fare as well at lighter loads where switching losses dominate.

While multiphase DC/DC converters are common in terrestrial DC-DC IC designs for high current, low voltage applications, they are new to the space market. Space-borne digital processing has evolved toward very low supply voltages and relatively high currents, the power product being thermally bounded by hardware in the heat removal path. The old 5V-centric power supply components available in space grade are unsuitable to produce these voltages. There are few or no qualified DC-DC modules capable of stepping down satellite bus voltages to 1V. This ratio lies outside practical conventional buck DC-DC converter duty cycle range and using transformer based topologies adds other penalties (complexity, mass, efficiency losses). However, space applications place a very high premium on efficiency. In applications where the load is always on and running at near full designed power, only full load (or load-point) efficiency matters. For an application which has a widely varying load, and especially one where more time is spent at low power than maximum power, light- to medium-load efficiency is a significant portion of power consumption and energy budget.

Produced in a commercial foundry technology, the DC/DC IC illustrated herein offers industry-leading performance in these areas. Specifically, the innovative digital control loop design and multiphase operation with phase-shedding intelligence addresses the key issues of transient step response, ripple, and efficiency across the load-space.

The digital control loop produces very fast settling/slewing against load-step response and good accuracy/overshoot/settling times even with much smaller filter capacitance than competitive devices. The test results show equivalent performance with about 1/10 the filtering capacitance of some other POLs, thus enabling compact realizations of on-board regulators close to the load. While the deflection under load step can be further improved by additional filtering capacitance, avoiding the expense and reliability penalty and board area of lots of space-grade tantalum and ceramic capacitors is very desirable for some applications. Moreover, high switching frequency also enables reduction of the size of the magnetics and the use of multiple small inductors offers more board layout flexibility and overall compactness.

Polyphase operation further enhances transient response, with current sharing accuracy between phases enhanced by autozero current comparators. The accurate current sharing is achieved by tuning the duty cycle information of the slave phases through a digital duty cycle calibrated delay line.

Moreover, the converter of the present invention can operate at input voltages of 3.3 V or below, where others cannot (due to fixed under-voltage lockout thresholds tailored to 5V operation, and/or to issues with operation at low supply voltage such as excess input current at full load, which can lead to setting a high UVLO threshold as a self-protection measure).

In one or more embodiments, the following features are achieved:
  Four-phase interleaved power stages with 10 A total output current capability (e.g., the chip can integrate power switch FETs in a multiphase configuration capable of delivering 10 A from a 5 V distribution bus).
  Peak Efficiency: 90% ($V_o$=1V).
  Integrated 80 mΩ/50 mΩ MOSFETs per Phase.
  Phase-shedding control for light-load efficiency.
  An all digital current sharing scheme for accurate current control among each phase.
  An efficiency enhancement scheme for high efficiency performance.
  No off-chip compensation components are needed for stability consideration.
  Soft Start and Internal Power Good.

References

The following references are incorporated by reference herein.
[1] P. Li, et al., "A Delay-Locked Loop Synchronization Scheme for High-Frequency Multiphase Hysteretic DC-DC Converters," IEEE J. Solid-State Circuits, vol. 44, no. 11, pp. 3131-3145, November 2009.
[2] C. Huang, et al., "An 82.4% Efficiency Package-Bond-wire-Based Four-Phase Fully Integrated Buck Converter with Flying Capacitor for Area Reduction," ISSCC Dig. Tech. Papers, pp. 362-364, February 2013.
[3] M. K. Song, et al., "A 6A 40 MHz Four-Phase ZDS Hysteretic DC-DC Converter with 118 mV Droop and 230 ns Response Time for a 5A/5 ns Load Transient," ISSCC Dig. Tech. Papers, pp. 80-81, February 2014.
[4] S. H. Lee, et al., "A 0.518 mm2 quasi-current-mode hysteretic buck DC-DC converter with 3 μs load transient response in 0.35 μm BCDMOS", ISSCC Dig. Tech. Papers, pp. 1-3, February 2015.
[5] P. Li, et al., "A 90-240 MHz hysteretic controlled DC-DC buck converter with digital phase locked loop synchronization," IEEE J. Solid-State Circuits, vol. 46, no. 9, pp. 2108-2119, September 2011.
[6] TI marketing literature TPS50601-SP POL.pdf 2012.
[7] Intersil ISL70001SRH SEE Test Report February 2010.
[8] Intersil JEDEC presentation, May 2010.
[9] TI TPS50601-SP Single Event Effects Test Report slak017.pdf Conclusion This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A DC/DC converter, comprising:
  a digital frequency synchronization circuit, including:
    a bang bang phase frequency detector (PFD);
    a PI compensator connected to the PFD; and
    a Digital to Analog Converter connected to the PI compensator; and
  an autozeroed comparator having a hysteretic window controlled by output current from the DAC in response a feedback frequency received from the autozeroed comparator, the autozeroed comparator detecting a continuous current mode (CCM)/discontinuous current mode (DCM) boundary during operation of the DC-DC converter;
  wherein:
    the autozeroed comparator controls a frequency $f_{sw}$ of an input voltage inputted to the DC/DC converter in response to feedback comprising detection of the CCM/DCM boundary at an output of DC/DC converter; and
    the digital frequency synchronization circuit and the autozeroed comparator form a digital phase locked loop (PLL) wherein:

the PFD compares the feedback frequency to a clock reference frequency CLK_ref and outputs a digital signal in response thereto, the PI compensator increments the digital signal if the feedback frequency is greater than the CLK_ref or decrements the digital signal if the feedback frequency is less than the CLK_ref; and the DAC's output current is increased in response to receiving the incremented digital signal, thereby increasing the hysteretic window and decreasing $f_{sw}$, and/or the DAC's output current is decreased in response to receiving the decremented digital signal, thereby decreasing the hysteretic window and increasing $f_{sw}$, so that $f_{sw}$ is locked to CLK_ref.

2. The converter of claim 1, wherein $f_{sw}$ has a frequency within 1.5% of CLK_ref.

3. The converter of claim 1, wherein the autozeroed comparator comprises a comparator pre-amplifier connected to a second stage comparator, wherein the pre-amplifier cancels the input referred offset of the autozeroed comparator.

4. The converter of claim 1, wherein the input referred offset is canceled so that the converter's output voltage error is within 2% of the converter's input voltage.

5. The converter of claim 4, wherein the comparator pre-amplifier includes a circuit measuring the input referred offset of the comparator pre-amplifier during a sampling phase and subtracts the measured input referred offset from input referred offset during a settling phase.

6. The converter of claim 5, wherein the autozeroed comparator further comprises a capacitor storing the output voltage error.

7. The converter of claim 5, wherein the pre-amplifier measures and subtracts the measured input referred offset at each cycle of $f_{sw}$ and/or in real time with operation of the DC/DC converter.

8. The converter of claim 1, wherein the DC/DC converter is a multiphase hysteretic DC/DC converter further comprising:

a master phase circuit including the digital frequency synchronization circuit and the autozeroed comparator;

a plurality of slave phase circuits connected to the master phase circuit.

9. The converter of claim 8, further comprising:

comparison circuits comparing a slave average current outputted from each of the slave phase circuits with a master average current outputted from the master phase circuit, the comparison circuits each outputting a comparison signal representing the difference between the slave average current and the master average current, for each of the slave phase circuits; and duty cycle calibration circuits receiving the comparison signals and adjusting a duty cycle signal applied to each of the slave phase circuits in response thereto, so that so that the duty cycle calibration circuits synchronize each slave phase circuit with the master phase circuit.

10. The converter of claim 9, wherein the duty cycle signals reduce the difference to within 2% of the slave average current and/or reduces a phase mismatch between the phases to within 10%.

11. The converter of claim 1 connected to a serial peripheral interface (SPI), wherein the SPI programs at least one parameter of the converter, the at least one parameter selected from feed forward gain of the digital PLL, dead time of the driver for the converter, and mode select between CCM and DCM.

12. A multiphase hysteretic DC/DC converter, comprising:

a master phase circuit;

a plurality of slave phase circuits connected to the master phase circuit;

a calibration code generator (CCG) circuit for each of the slave phase circuits, each of the CCG circuits:

comparing an average current outputted from the slave phase circuit with a master average current outputted from the master phase circuit, outputting a first signal when a slave average current from the slave phase circuit is higher than the master average current in the master phase circuit, and outputting a second signal when the slave average current from the slave phase circuit is lower than the master average current from the master phase circuit; and a digitally controlled Delay-Locked-Loop based duty cycle calibration block (DCC) circuit for each of the slave phase circuits, the DCC circuit connected to a delay line, and the delay line comprising a duty cycle addition (DCA) block and a duty cycle subtraction (DCS) block, wherein:

(i) if a second phase current $I_{p2}$ of the slave phase circuit is larger than a first phase current $I_{p1}$ of the master phase circuit, the DCC circuit uses an AND gate to decrease a raw duty cycle signal of the slave phase circuit until $I_{p1}$ is equal to $I_{p2}$, (ii) if $I_{p2}$ is smaller than $I_{p1}$, the DCC circuit uses an OR gate to increase the raw duty cycle signal by an amount determined by the CCG, and (iii) during steps (i)-(ii), a rising edge of the raw duty cycle signal does not change so that the DCA block, the DCS block, the DCC circuit and the CCG circuits are used to calibrate the raw duty cycle signal without affecting a phase synchronization timing sequence in the converter.

13. The converter of claim 12, wherein the raw duty cycle signals reduce the difference to within 2% of the slave average current and/or reduce a phase mismatch to within 10%.

14. The converter of claim 12, wherein the master phase circuit shuts down one or more of the slave phases when load current is below a threshold value.

15. The converter of claim 12, wherein the master phase circuit further comprises:

a digital frequency synchronization (DFS) circuit; and an autozeroed comparator having a hysteretic window controlled by the DFS circuit in response a feedback frequency received from the autozeroed comparator, the autozeroed comparator detecting a continuous current mode (CCM)/discontinuous current mode (DCM) boundary during operation of the DC-DC converter;

wherein:

the autozeroed comparator controls a frequency $f_{sw}$ of the input voltage inputted to the DC/DC converter in response to feedback comprising detection of the CCM/DCM boundary at an output of DC/DC converter; and the digital frequency synchronization circuit and the autozeroed comparator form a phase locked loop wherein the DFS controls the hysteretic window so as to lock $f_{sw}$ to a clock reference frequency.

16. The converter of claim 15, wherein:

the autozeroed comparator comprises a comparator pre-amplifier connected to a second stage comparator, wherein the pre-amplifier cancels the input referred offset of the autozeroed comparator, and the input referred offset is canceled so that the converter's output voltage error is within 2% of the converter's input voltage.

17. The converter of claim 12 connected to a serial peripheral interface (SPI), wherein the SPI programs the converter.

18. An integrated circuit, comprising:
a master phase circuit including:
  a digital frequency synchronization (DFS) circuit; and
  an autozeroed comparator having a hysteretic window controlled by the DFS circuit in response a feedback frequency received from the autozeroed comparator, the autozeroed comparator detecting a continuous current mode (CCM)/discontinuous current mode (DCM) boundary during operation of a DC-DC converter, wherein:
  the autozeroed comparator controls a frequency $f_{sw}$ of an input voltage inputted to the DC/DC converter in response to feedback comprising detection of the CCM/DCM boundary at an output of the DC/DC converter; and
  the digital frequency synchronization circuit and the autozeroed comparator form a phase locked loop wherein the DFS controls the hysteretic window so as to lock $f_{sw}$ to a clock reference frequency; and
a plurality of slave phase circuits connected to the master phase circuit;
comparison circuits comparing a slave average current outputted from each of the slave phase circuits with a master average current outputted from the master phase circuit, the comparison circuits each outputting a comparison signal representing the difference between the slave average current and the master average current, for each of the slave phase circuits; and
duty cycle calibration circuits receiving the comparison signals and adjusting a duty cycle signal applied to each of the slave phase circuits in response thereto, so that the duty cycle calibration circuits synchronize each slave phase circuit with the master phase circuit.

19. The converter of claim 18 connected to a serial peripheral interface (SPI), wherein the SPI programs the converter.

20. A satellite, comprising comprising a processor powered by the DC/DC converter of claim 18.

* * * * *